(12) United States Patent
Seo et al.

(10) Patent No.: US 7,541,097 B2
(45) Date of Patent: Jun. 2, 2009

(54) ORGANIC ELECTROLUMINESCENT DEVICE AND METHOD FOR FABRICATING THE SAME

(75) Inventors: Jeong Dae Seo, Gyeonggi-do (KR); Hee Jung Kim, Seoul (KR); Kyung Hoon Lee, Seoul (KR); Hyoung Yun Oh, Seoul (KR); Myung Seop Kim, Seoul (KR); Chun Gun Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 362 days.

(21) Appl. No.: 10/779,874

(22) Filed: Feb. 18, 2004

(65) Prior Publication Data

US 2004/0161632 A1 Aug. 19, 2004

(30) Foreign Application Priority Data

Feb. 19, 2003 (KR) ............... 10-2003-10394

(51) Int. Cl.
*H01L 51/54* (2006.01)
*H05B 33/14* (2006.01)
*H01L 29/20* (2006.01)

(52) U.S. Cl. ............ 428/690; 428/917; 313/504; 313/506; 257/89

(58) Field of Classification Search ........ 428/690, 428/917; 313/504, 506; 427/66; 257/40, 257/89

See application file for complete search history.

(56) References Cited

U.S. PATENT DOCUMENTS

| 6,515,314 | B1 | 2/2003 | Duggal et al. | 257/184 |
| 6,885,025 | B2 * | 4/2005 | Tung et al. | 257/40 |
| 2005/0100658 | A1 * | 5/2005 | MacPherson et al. | 427/58 |
| 2006/0084347 | A1 * | 4/2006 | Tutt et al. | 445/24 |

FOREIGN PATENT DOCUMENTS

| EP | 0903965 | | 3/1999 |
| JP | 2002-260858 | * | 9/2002 |
| JP | 2003-031359 | | 1/2003 |
| JP | 2003-031371 | | 1/2003 |
| JP | 2003-036978 | | 2/2003 |

OTHER PUBLICATIONS

International Search Report Dated Aug. 30, 2004.

* cited by examiner

*Primary Examiner*—D. Lawrence Tarazano
*Assistant Examiner*—Camie S Thompson
(74) *Attorney, Agent, or Firm*—Holland & Knight LLP

(57) ABSTRACT

Disclosed are an organic electroluminescent device and a method for fabricating the same. The device includes a substrate, a first electrode formed on the substrate, an emission layer formed over the first electrode, and having a first emission area, a second emission area, and a third emission area, a hole blocking layer formed on the emission layer, the hole blocking layer being formed of the same substance as that of the third emission area, and a second electrode formed over the hole blocking layer.

15 Claims, 3 Drawing Sheets

ORGANIC ELECTROLUMINESCENT DEVICE AND METHOD FOR FABRICATING THE SAME

CROSS-REFERENCE TO RELATED APPLICATIONS

This application claims the benefit of Korean Application No. P2003-10394, filed on Feb. 19, 2003, which is hereby incorporated by reference as if fully set forth herein.

BACKGROUND OF THE INVENTION

1. Field of the Invention

The present invention relates to an organic electroluminescent device, and more particularly, to an organic electroluminescent device having a hole-blocking layer and a method for fabricating the same.

2. Discussion of the Related Art

Recently, with the trend of large sized display devices, demand for flat display devices occupying smaller space has been increased. An example of the flat display device is an organic electroluminescent device, also referred to as an organic light emitting diode (OLED). And, technology for the organic electroluminescent display is under rapid development, whereby various prototypes have been in market already.

The organic electroluminescent device is a light emitting device, whereby electric charges are injected in an organic layer formed between an anode and a cathode, so as to form a pair of electron and hole which generates an exciton, an excited state of which falls to a ground state, thereby emitting light.

The organic electroluminescent device is advantageous in that the device is formed on a flexible transparent substrate, such as plastic, and operated at a lower voltage (less than 10V), as compared to a plasma display panel or an inorganic electroluminescent display.

Also, the organic electroluminescent device requires less power consumption and provides a wide range of colors. Moreover, the organic electroluminescent device enables to express three colors including green, blue, and red. Therefore, the organic electroluminescent device is viewed and considered as the next generation full-color display device.

The organic electroluminescent device generates an exciton by coupling a hole from a hole transport layer with an electron form the hole transport layer, the exciton corresponding to a luminescent area.

However, the exciton can be generated by the fast transport speed of the hole in another area except the luminescent area.

The exciton generated in another area except the luminescent area illuminates in that area only, thus, there is a problem lowering color purity and brightness.

Therefore, for increasing the performance and the brightness of the device, a material blocking a movement of the hole needs to be formed around the luminescent layer.

SUMMARY OF THE INVENTION

Accordingly, the present invention is directed to an organic electroluminescent device and a method for fabricating the same that substantially obviate one or more problems due to limitations and disadvantages of the related art.

An object of the present invention is to provide an organic electroluminescent device and a method for fabricating the same that can enhance brightness and color purity.

Another object of the present invention is to provide an organic electro-luminescent device and a method for fabricating the same that can simplify the process steps of fabrication.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescent device includes a substrate, a first electrode formed on the substrate, an emission layer formed over the first electrode, and having a first emission area, a second emission area, and a third emission area, a hole blocking layer formed on the emission layer, the hole blocking layer being formed of the same substance as that of the third emission area, and a second electrode formed over the hole blocking layer.

Herein, a hole injection layer and a hole transport layer are sequentially formed between the first electrode and the emission layer, and at least one of an electron transport layer and an electron injection layer is formed between the hole blocking layer and the second electrode.

Also, the first emission area is a green emission area, the second emission area is a red emission area, and the third emission area is a blue emission area.

Herein, at least one of the first emission area and the second emission area is formed of a phosphorescent substance, and the third emission layer is formed of a fluorescent substance.

The hole blocking layer is formed of any one of a plurality of substances forming the third emission area.

In another aspect of the present invention, a method for fabricating an organic electroluminescent device includes forming a first electrode on a substrate, forming a first emission layer in a first emission area over the first electrode, forming a second emission layer in a second emission area over the first electrode, forming a third emission layer in a third emission area over the first electrode, and subsequently forming a hole blocking layer on the first, second, and third emission layers by using a substance of the third emission layer, and forming a second electrode over the hole injection layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

The organic electroluminescent device and the method for fabricating the same according to the present invention will now be described as follows.

Figure 1:
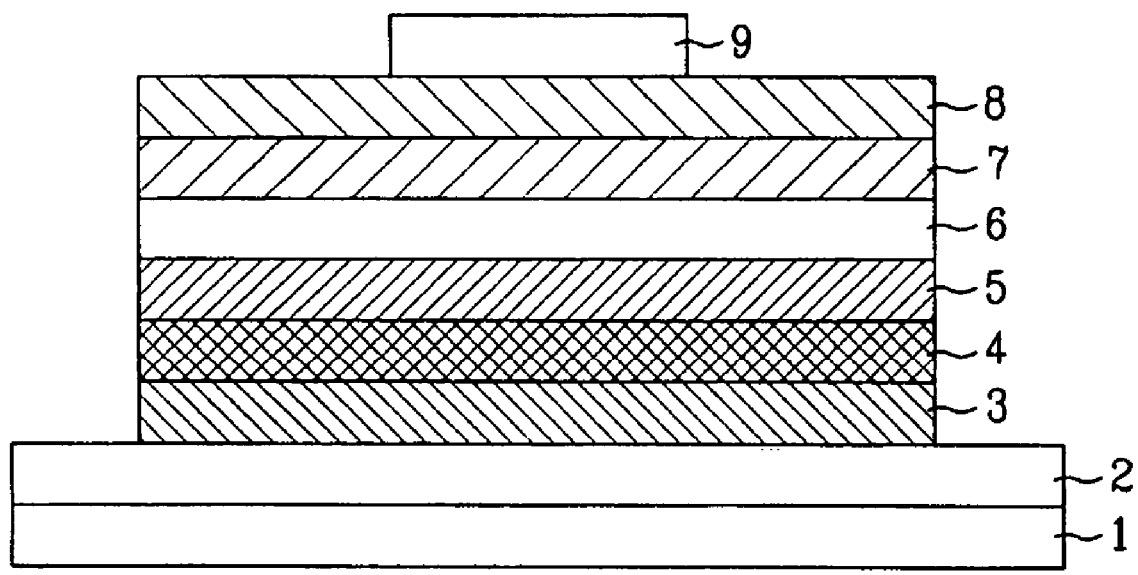
FIG. 1 illustrates a cross-sectional view showing a structure of an organic electroluminescent device according to the present invention.

FIG. 1 illustrates a cross-sectional view showing a structure of an organic electroluminescent device according to the present invention.

Referring to FIG. 1, the organic electroluminescent device according to the present invention includes a substrate 1 having a first electrode 2, a hole injection layer 3, a hole transport layer 4, an emission layer 5, a hole blocking layer 6, an electron transport layer 7, an electron injection layer, and a second electrode 9 serially formed thereon.

Herein, the emission layer 5 is divided into a first emission area, a second emission area, and a third emission area. And, in some cases, the electron transport layer 7 and the electron injection layer 8 may be omitted from the structure.

In the present invention, the first emission area is a green (G) emission area, the second emission area is a red (R) emission area, and the third emission area is a blue (B) emission area. The hole blocking layer 5 according to the present invention may also be formed of a blue light-emitting substance, which forms the third emission area.

In addition, at least one of the first and second emission areas may be formed of a phosphorescent substance, and the third emission area may be formed of a fluorescent substance. More specifically, the green emission area may be formed of the phosphorescent substance, and the red and blue emission areas may be formed of the fluorescent substance. Alternatively, the red emission area may be formed of the phosphorescent substance, and the green and blue emission areas may be formed of the fluorescent substance. Furthermore, the red and green emission areas may be formed of the phosphorescent substance, and the blue emission area may be formed of the fluorescent substance.

Moreover, when the blue emission area corresponding to the third emission area is formed of more than one substance, then the hole blocking layer 6 may either be formed of the same substance as that of the blue emission area, or be formed of at least one of the substances forming the blue emission layer.

In the present invention, the hole blocking layer 6 can be formed of any one of the substances listed in the Chemical Formula 1 shown below.

Chemical Formula 1

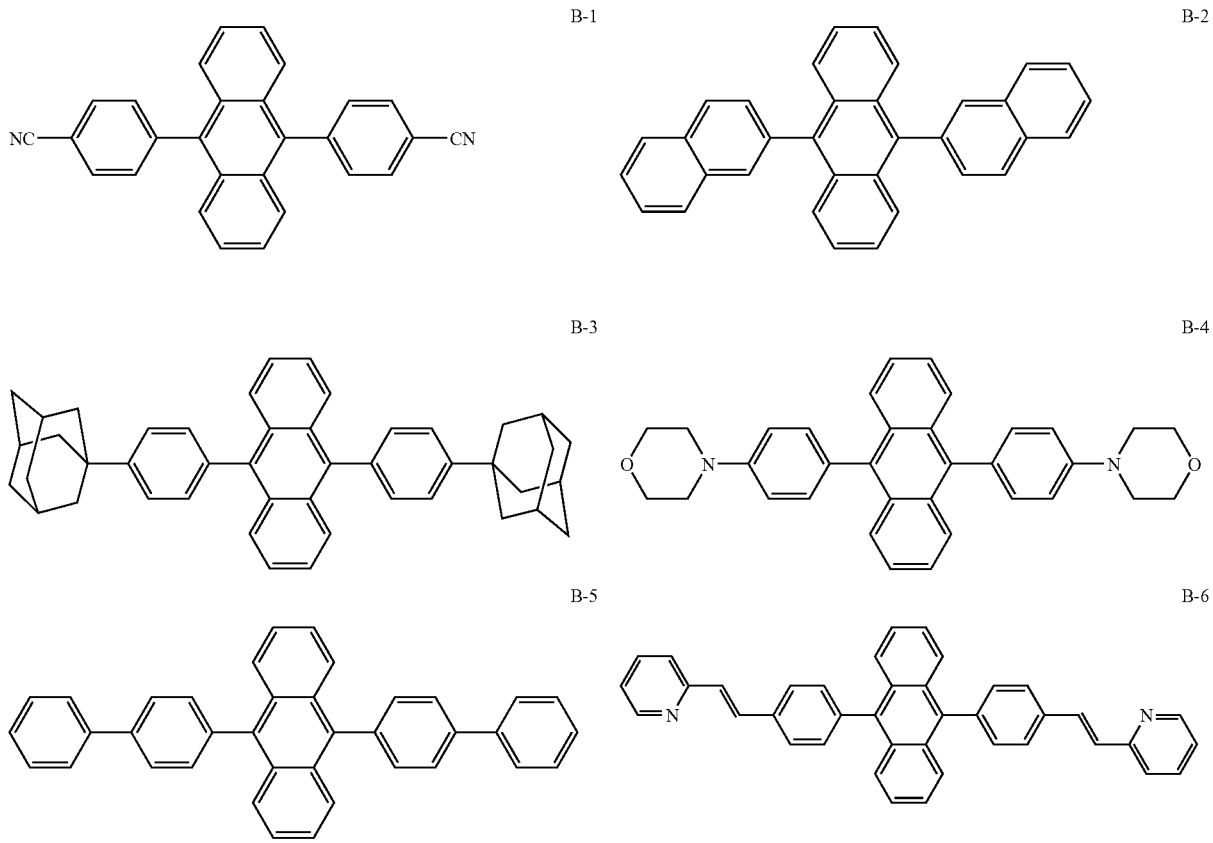

-continued
B-7
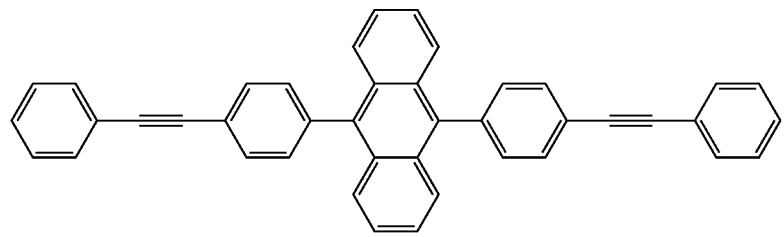
B-8
B-9
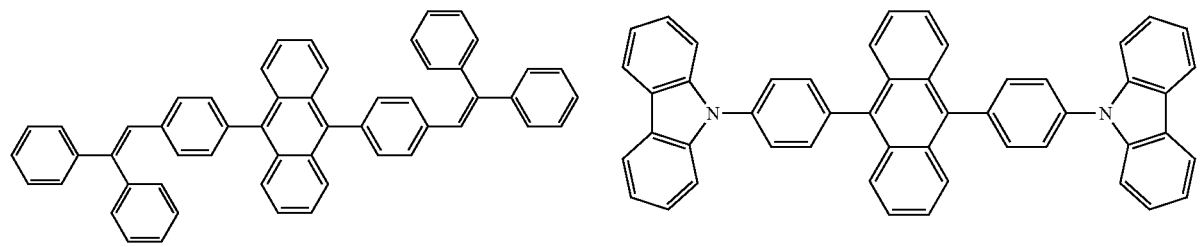
B-10
B-11
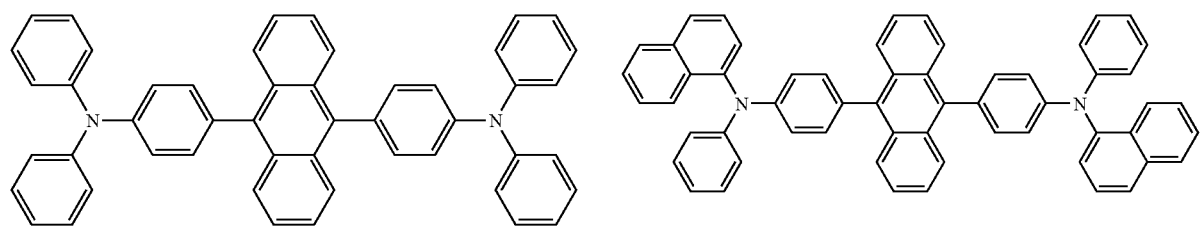
B-12
B-13
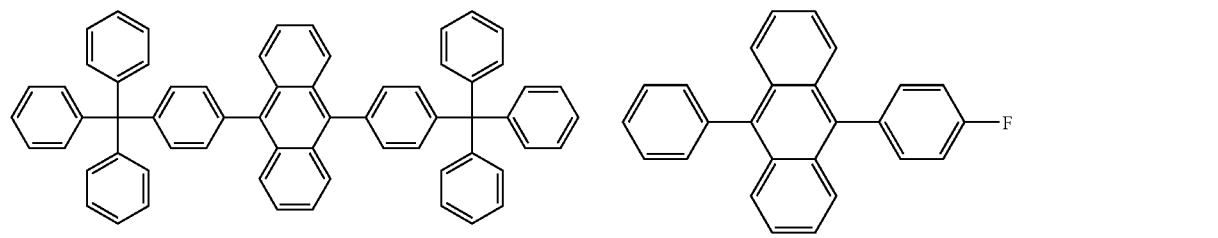
B-14
B-15
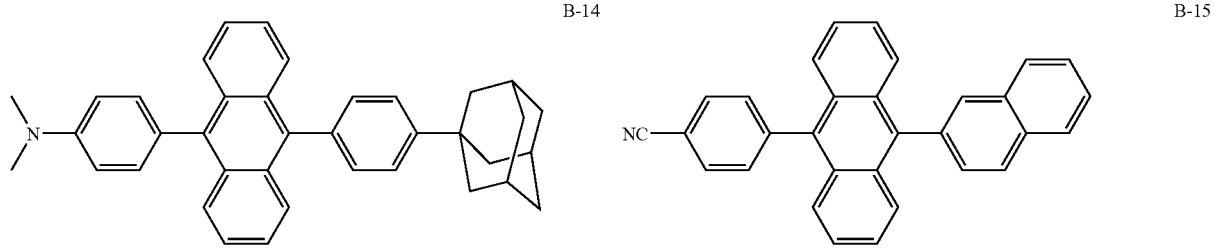
B-16
B-17
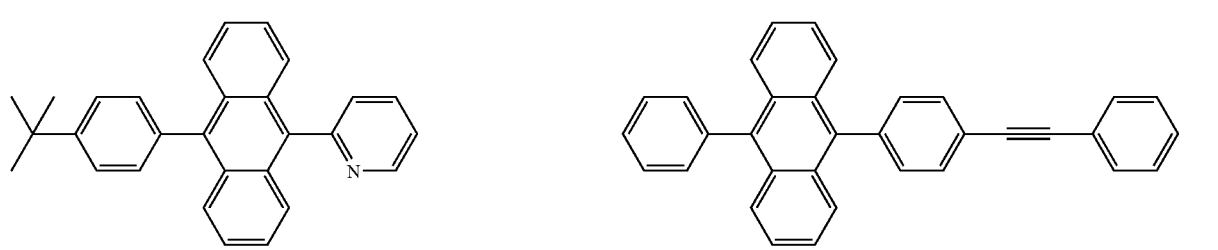

-continued
B-18 B-19
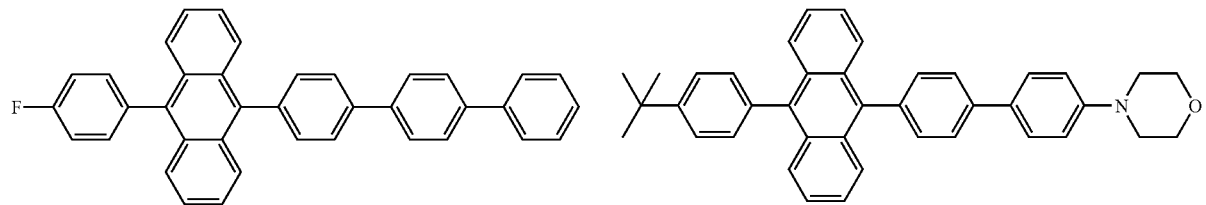
B-20 B-21
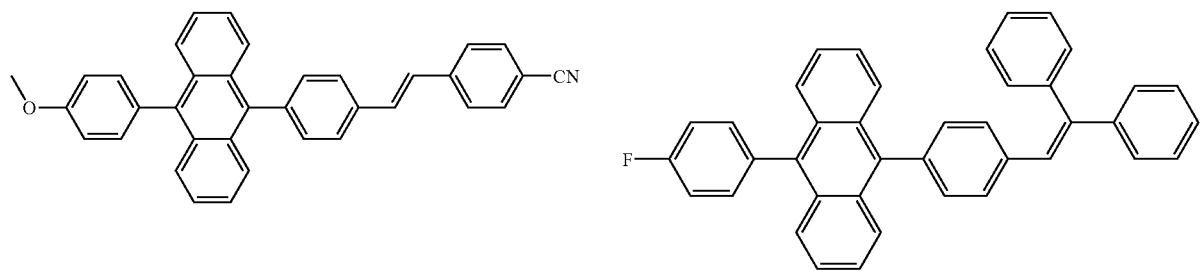
B-22 B-23
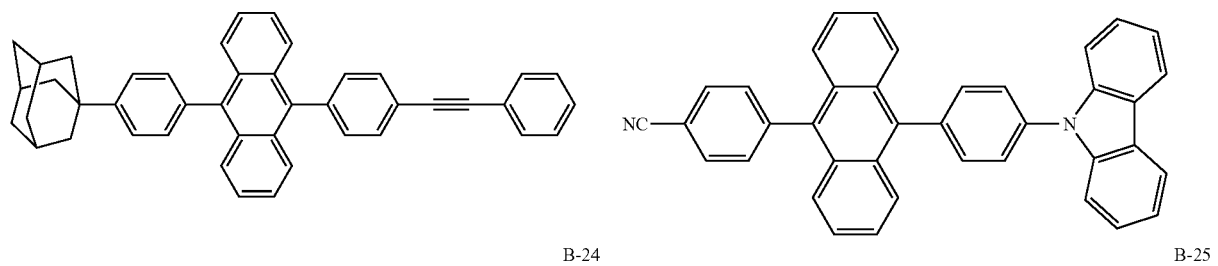
B-24 B-25
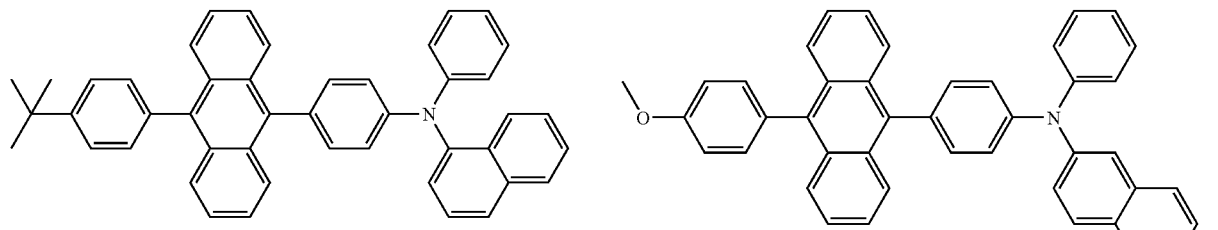
B-26 B-27
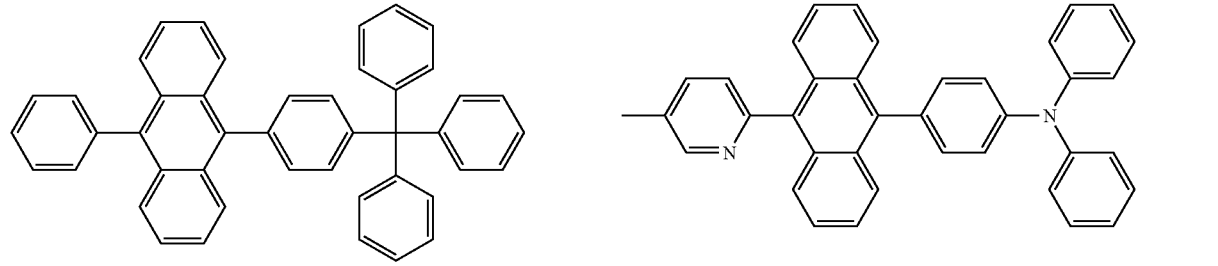
B-28 B-29
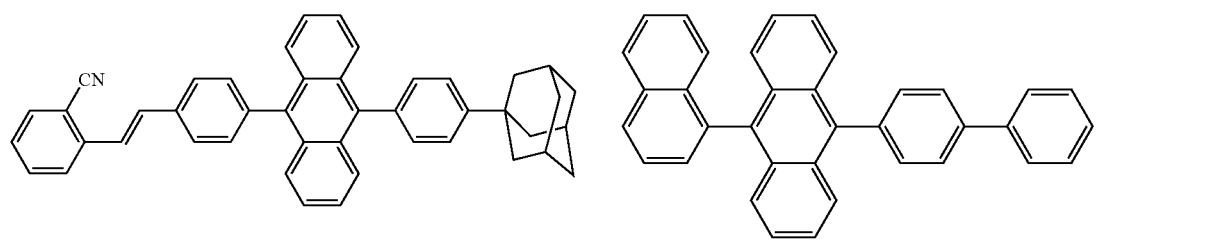

-continued
B-30
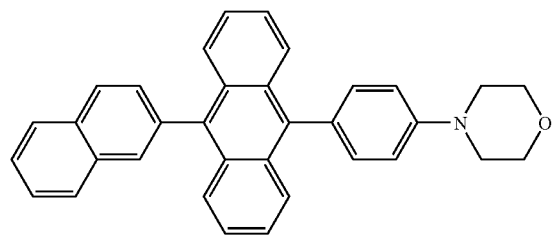
B-31
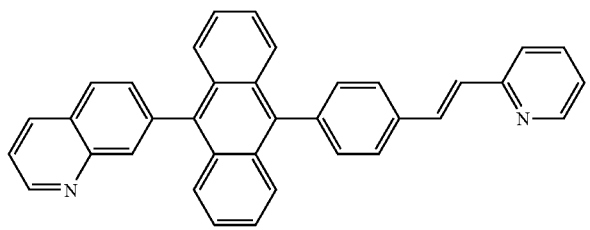
B-32
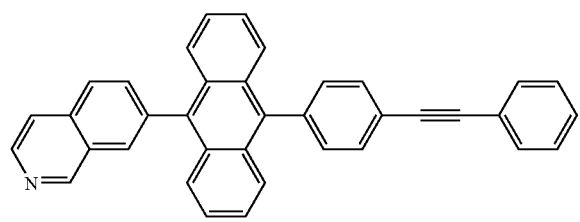
B-33
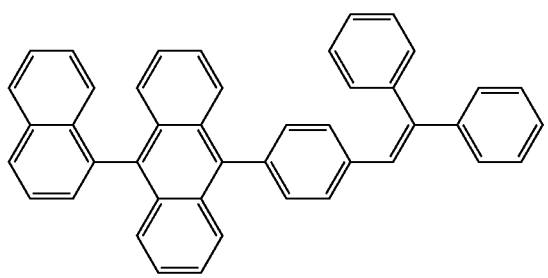
B-34
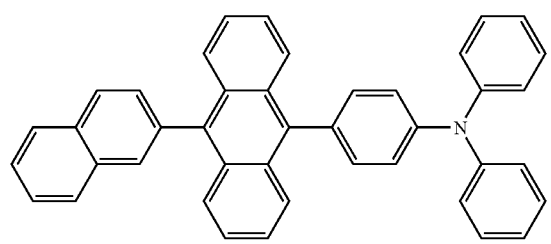
B-35
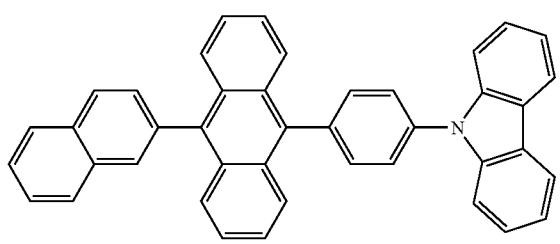
B-36
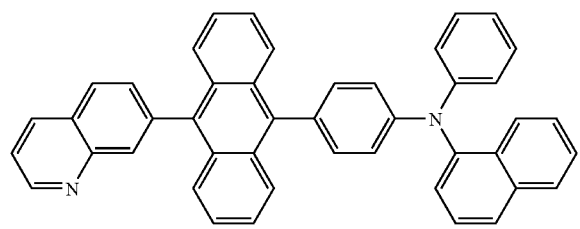
B-37
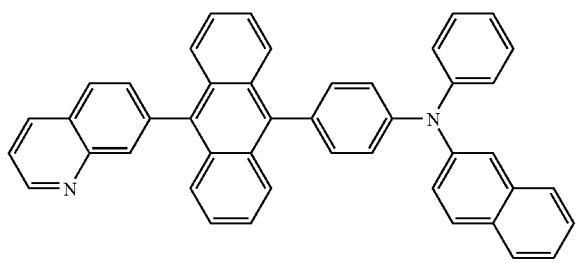
B-38
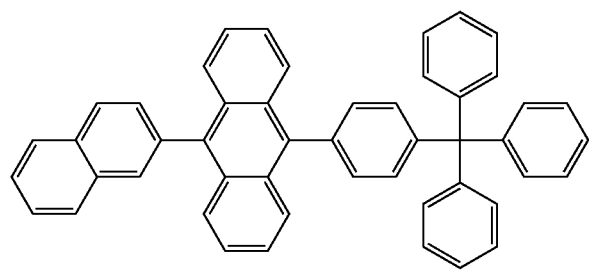
B-39
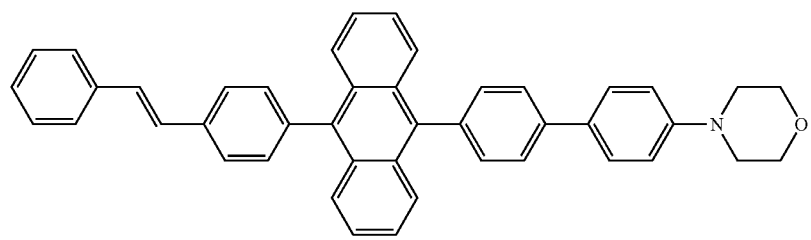

-continued
B-40
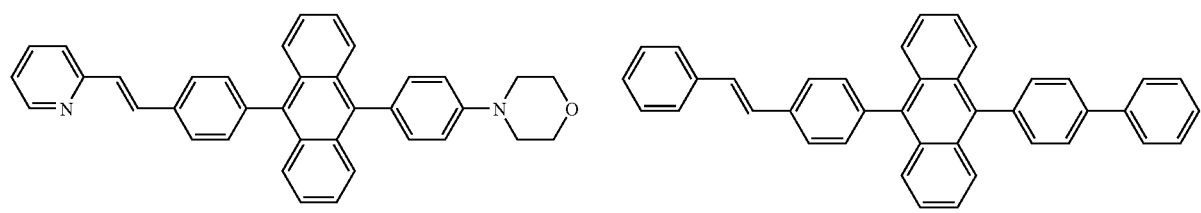
B-41
B-42
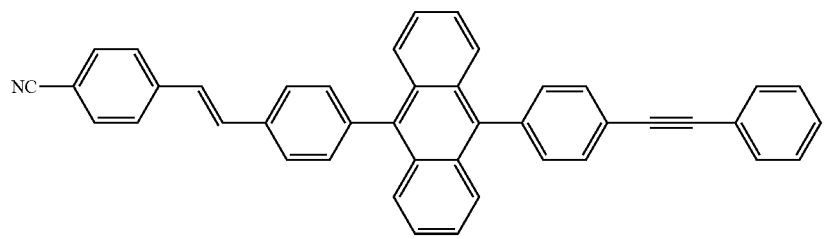
B-43
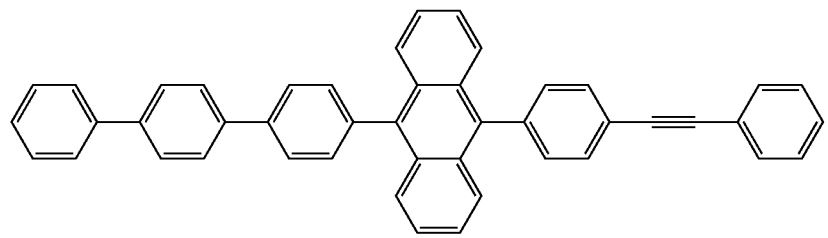
B-44
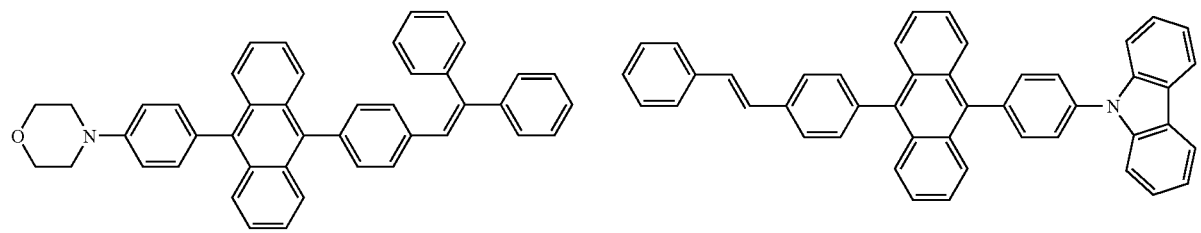
B-45
B-46
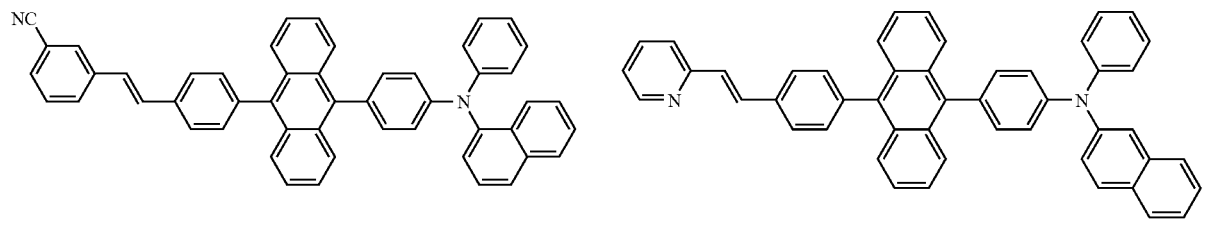
B-47
B-48
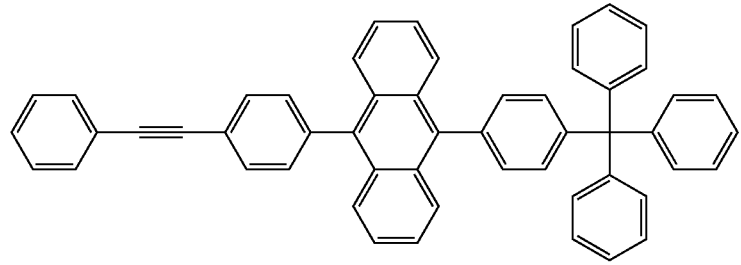

-continued
B-49
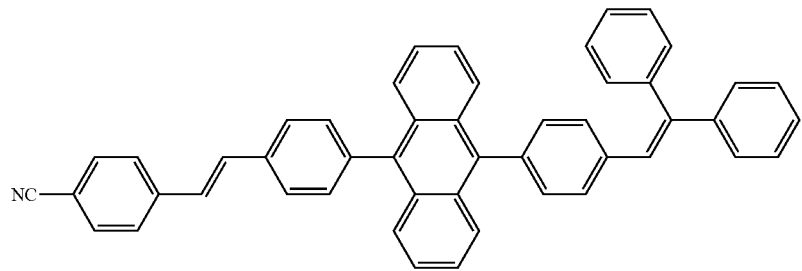
B-50
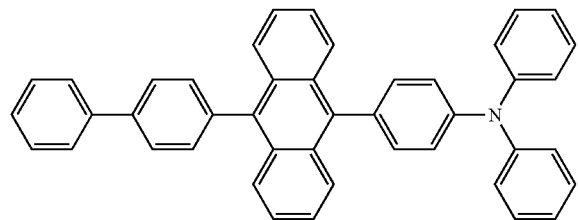
B-51
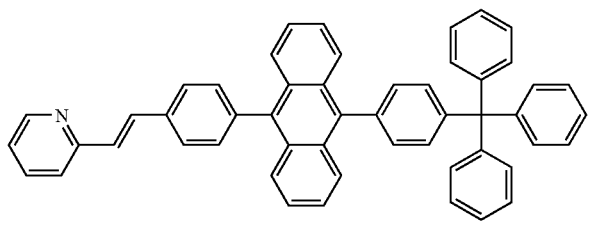
B-52
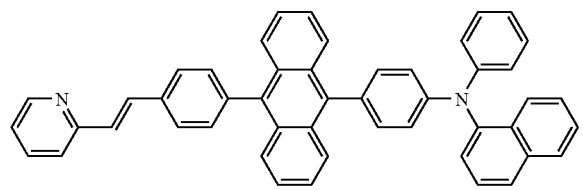
B-53
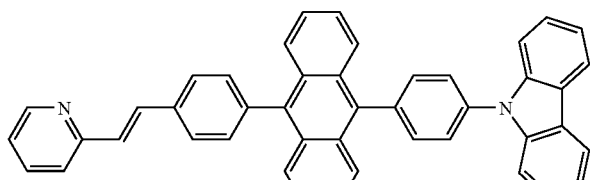
B-54
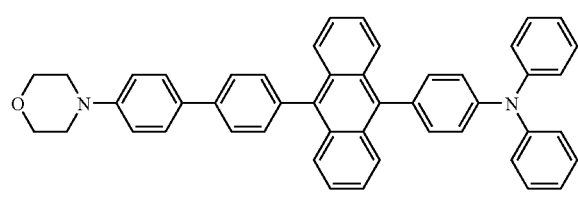
B-55
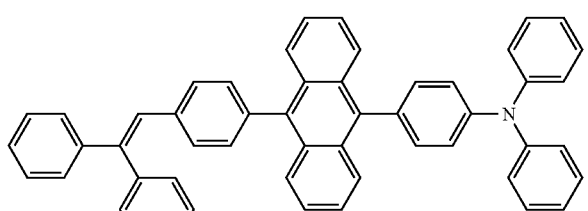
B-56
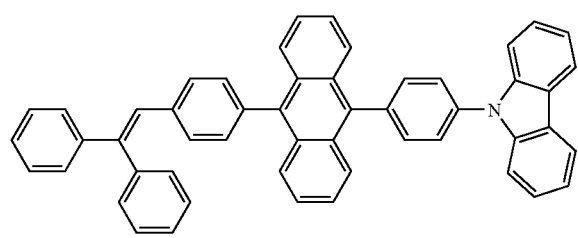
B-57
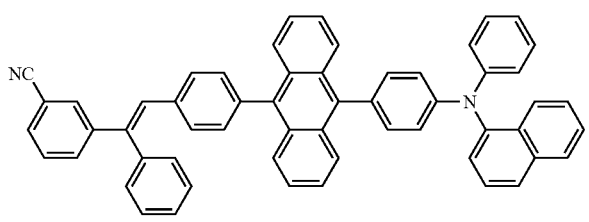
B-58
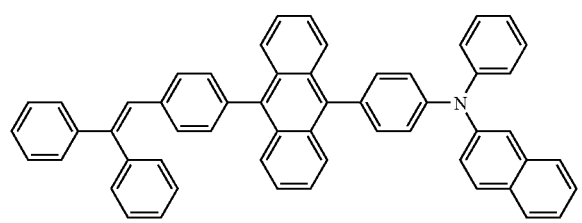
B-59
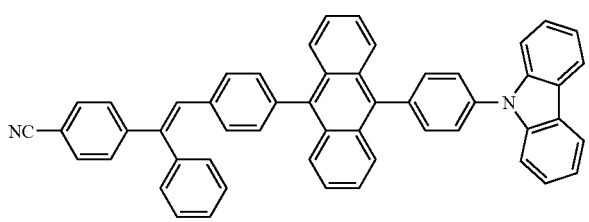

-continued

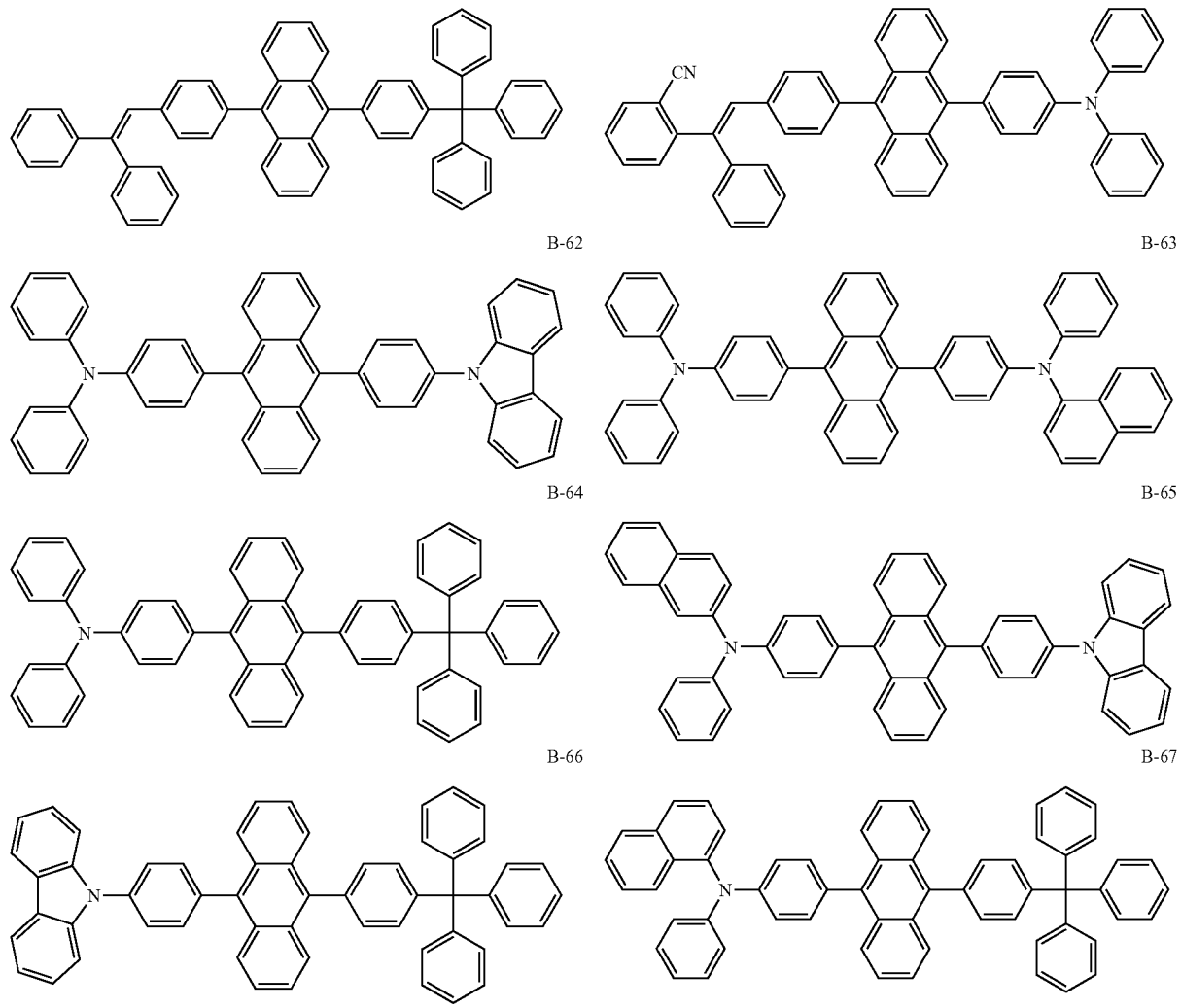

The method for fabricating the organic electroluminescent device having the above-described structure will now be described.

FIGS. 2A to 2D illustrate the process steps of the method for fabricating the organic electroluminescent device according to the present invention.

Figure 2A:
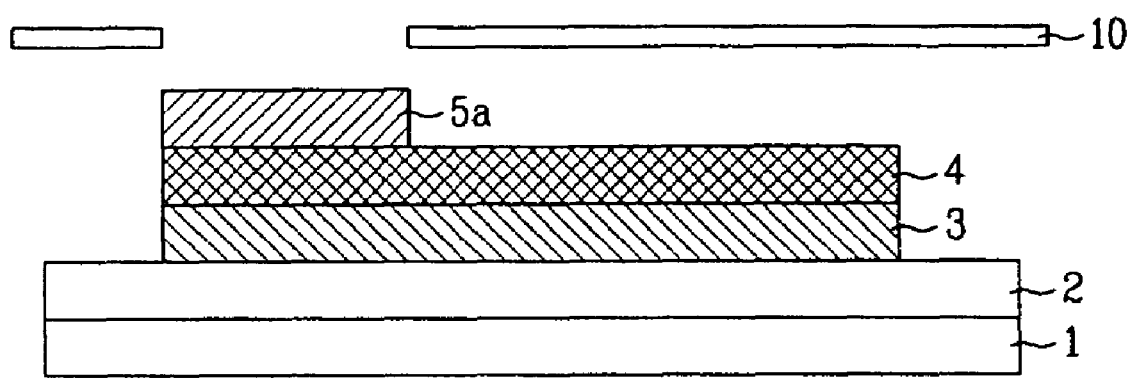
FIGS. 2A to 2D illustrate the process steps of the method for fabricating the organic electroluminescent device according to the present invention.
Figure 2B:
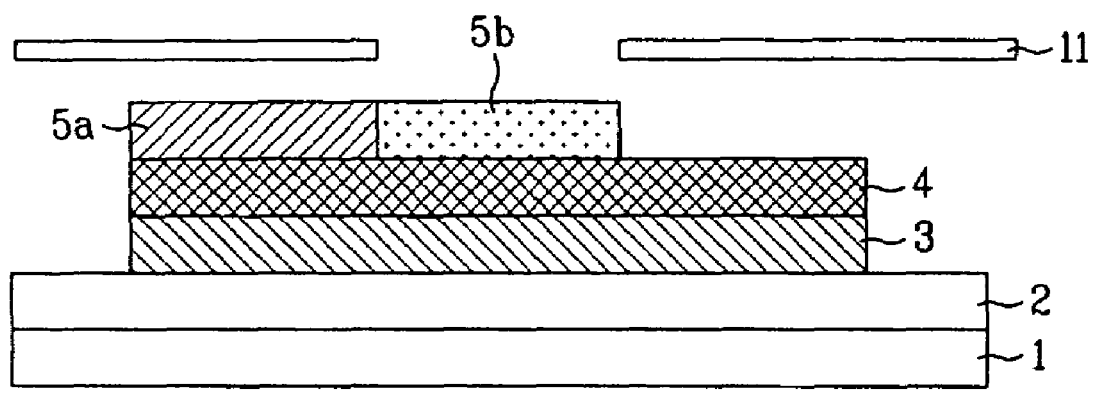

As shown in FIG. 2A, the first electrode 2, the hole blocking layer 3, and the hole transport layer 4 are serially formed on the substrate 1. Then, a first emission layer 5a is formed in the first emission area by using a first mask 10. Subsequently, as shown in FIG. 2B, a second emission layer 5b is formed in the second emission area by using a second mask 11.

Figure 2C:
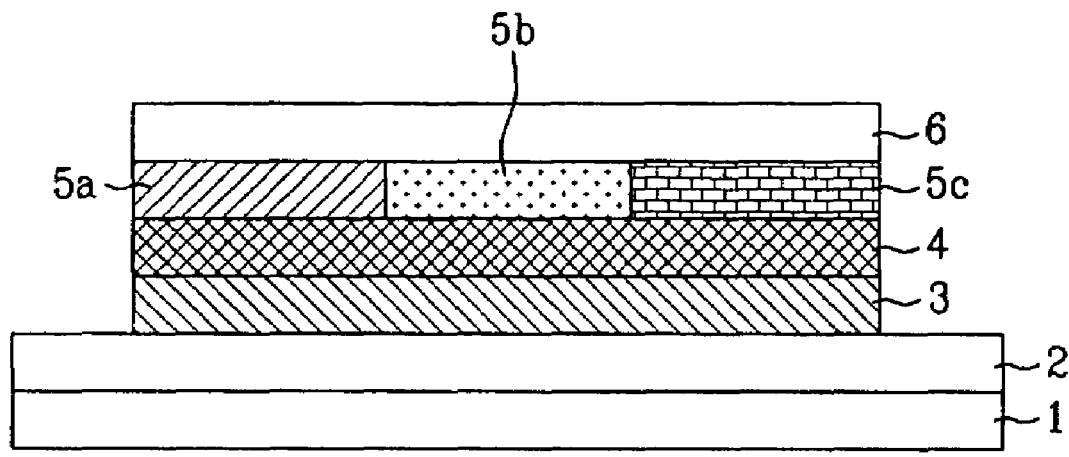
Figure 2D:
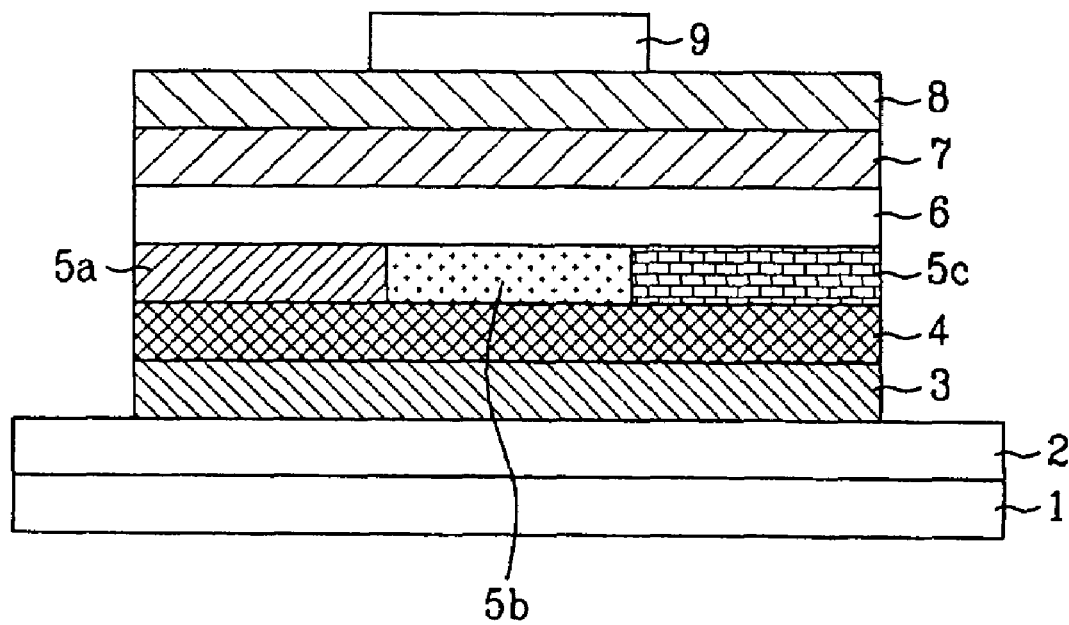

Thereafter, referring to FIG. 2C, a third emission layer 5c is formed in the third emission area. And, sequentially, the substance of the third emission layer is used to form the hole blocking layer 6 on the first, second, and third emission layers 5a, 5b, and 5c. Furthermore, as shown in FIG. 2D, the electron transport layer 7, the electron injection layer 8, and the second electrode 9 are sequentially formed on the hole blocking layer 6, thereby forming the organic electroluminescent device according to the present invention.

Hereinafter, a preferred embodiment of the organic electroluminescent device will be described according to the present invention.

EMBODIMENT

An ITO glass is patterned so as to have a size of 2 mm×2 mm. The patterned ITO glass is then cleaned.

A substrate is loaded on a vacuum chamber of which basic pressure is set up as $1 \times 10^{-6}$ torr and CuPC(200 Å), NPD(400 Å), CBP+(btp)$_2$Ir(acac)(8%)(200 Å), the hole-blocking layer (100 Å), Alq$_3$(300 Å), LiF(5 Å), Al(1000 Å) are deposited on the ITO in order.

When B-60 is used as the hole-blocking layer, 1135 cd/m$^2$ (9.30V) is shown at about 1 mA, brightness shows about 3.2 cd/A, whereby CIE is x=0.661, y=0.328.

COMPARATIVE EMBODIMENT

The ITO glass is patterned so as to have a size of 3mm×3 mm. The patterned ITO glass is then cleaned. A substrate is loaded on a vacuum chamber, the basic pressure of which is set up as 1×10⁻⁶ torr and CuPC(200 Å), NPD(400 Å), CBP+ (btp)₂Ir(acac)(8%)(200 Å), a hole blocking layer (100 Å), Alq₃(300 Å), LiF(5 Å), Al(1000 Å) are sequentially deposited on the ITO.

When Balq is used to form the hole blocking layer, 1018 cd/m²(9.97V)1135 cd/m²(9.30V) is shown at about 1 mA, brightness shows about 1018 cd/m²(9.97V), whereby CIE ёx=0.659, y=0.329. Lifetime (half of first brightness) shows 2000 cd/m² at about 1 mA.

Accordingly, a hole blocking layer is formed between an anode and a cathode of the organic electroluminescent device according to the present invention. The hole blocking layer allows the organic electroluminescent device to provide enhanced brightness and color purity.

Furthermore, by forming the hole blocking layer with the same substance as that of the blue emission layer, the fabrication process is simplified, thereby improving productivity and reducing the fabrication cost and the cost of the device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescent device, comprising:
    a substrate;
    a first electrode formed on the substrate;
    an emission layer formed over the first electrode, the emission layer comprising a green emission layer formed in a first emission area, a red emission layer formed in a second emission area, and a blue emission layer formed in a third emission area;
    a hole blocking layer formed over the green, red, and blue emission layers, the hole blocking layer being formed of substantially a same substance as that of the blue emission layer; and
    a second electrode formed over the hole blocking layer,
    wherein the green, red, and blue emission layers are substantially coplanar layers, and
    wherein the hole blocking layer is formed of any one of a plurality of substances listed below:

B-1

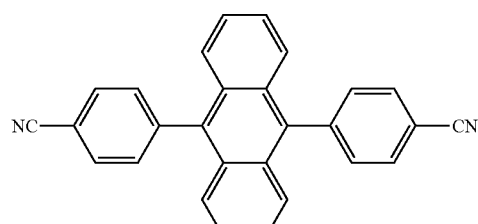

B-3

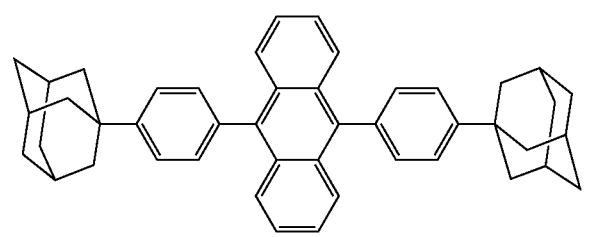

-continued

B-4

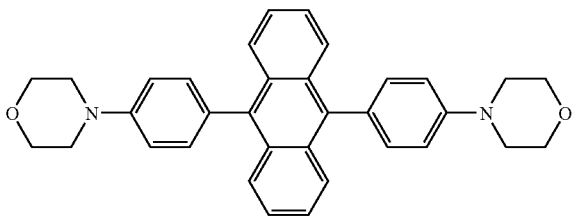

B-5

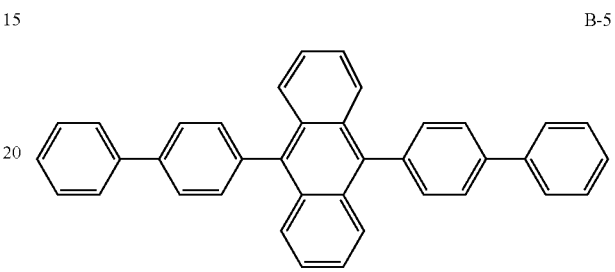

B-6

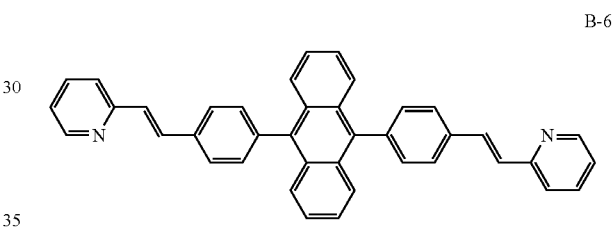

B-7

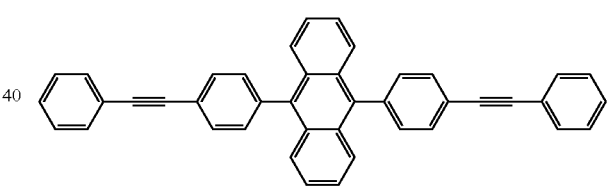

B-8

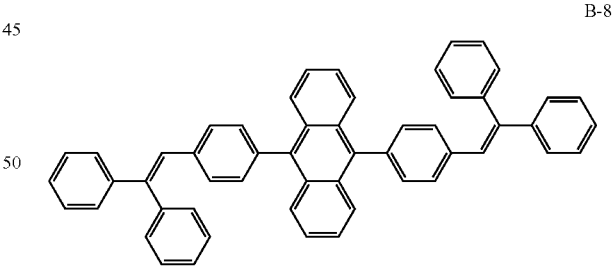

B-9

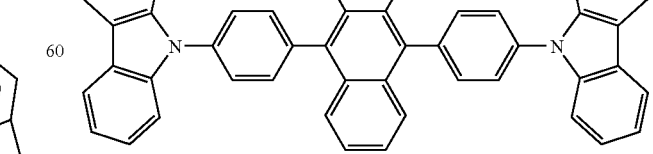

-continued
B-10
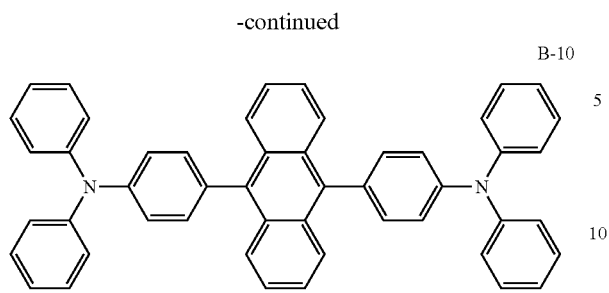
B-11
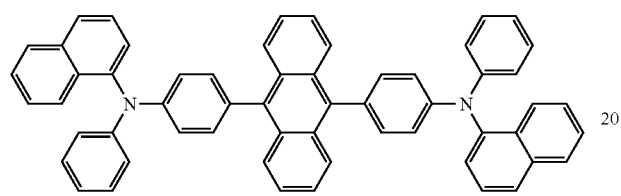
B-12
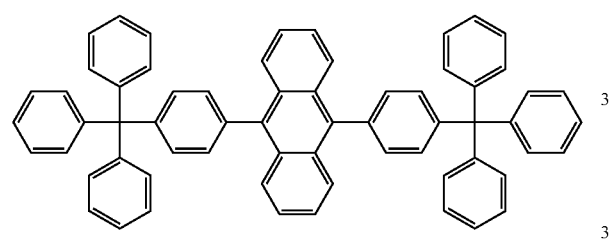
B-13
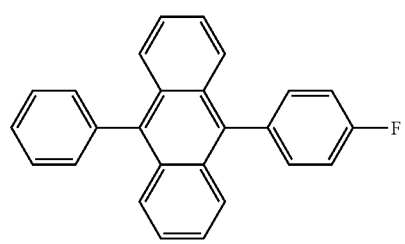
B-14
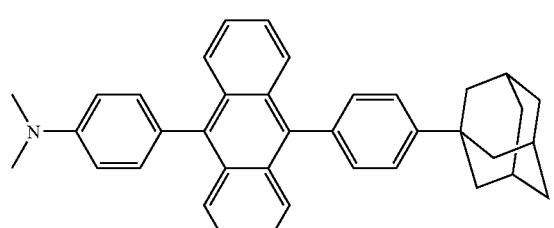
B-15
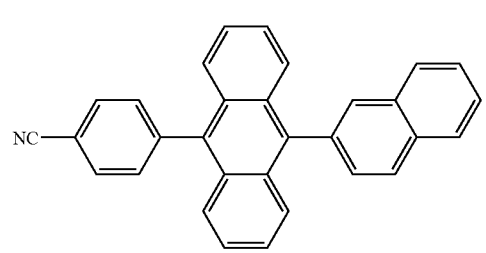
-continued
B-16
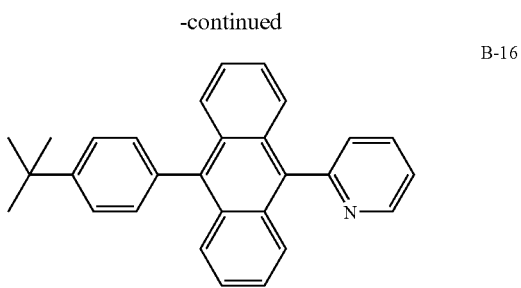
B-17
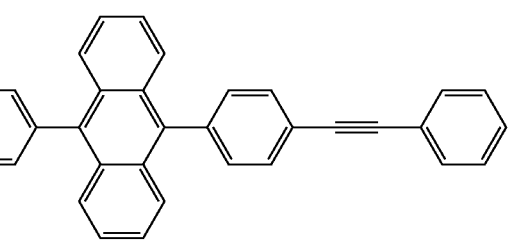
B-18
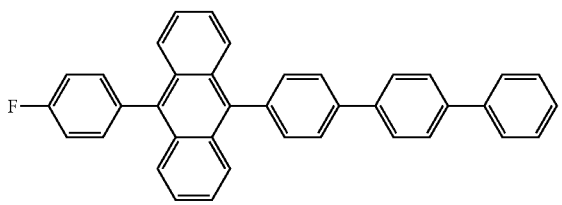
B-19
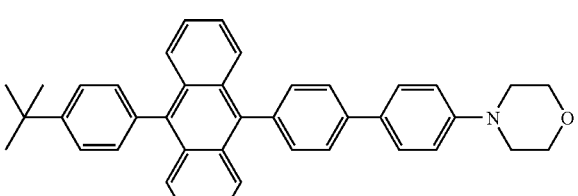
B-20
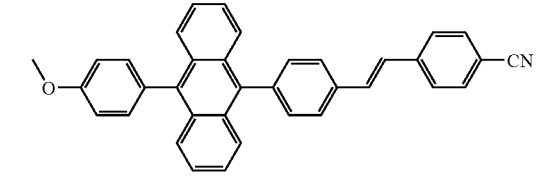
B-21
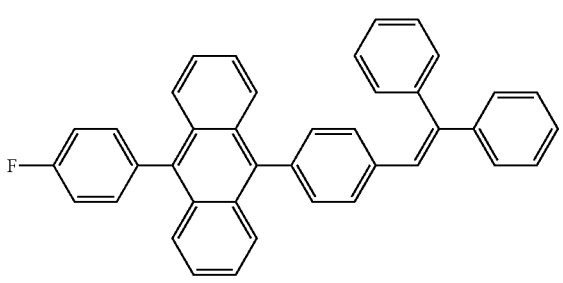

-continued
B-22
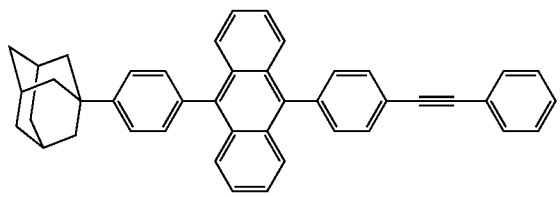
B-28
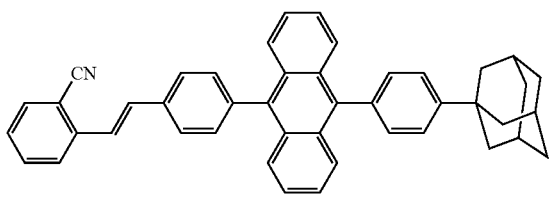
B-23
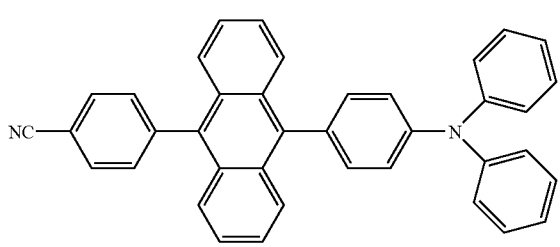
B-29
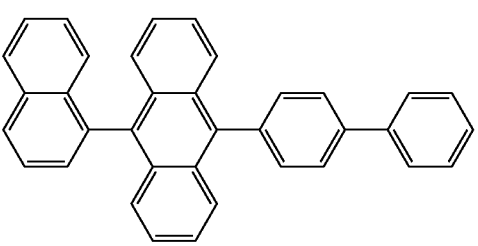
B-24
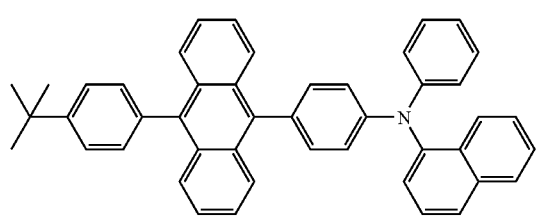
B-30
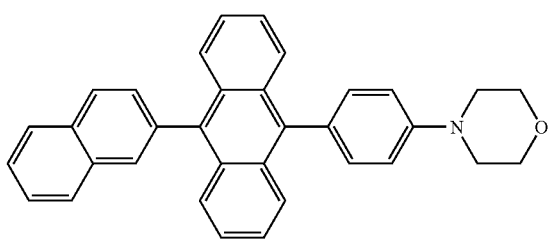
B-25
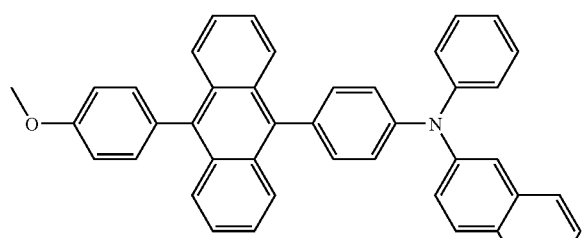
B-31
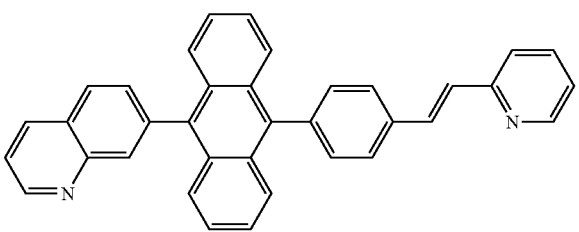
B-26
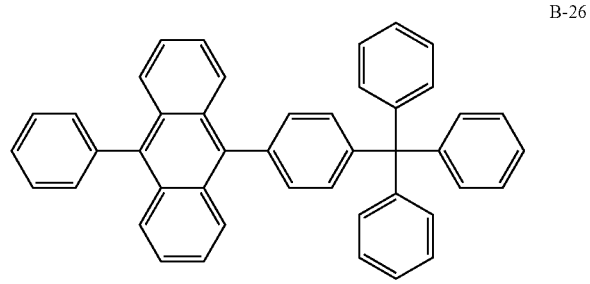
B-32
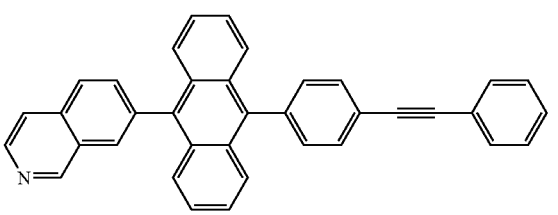
B-27
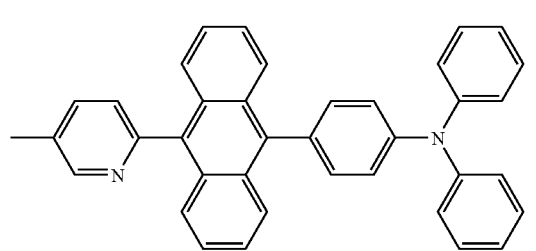
B-33
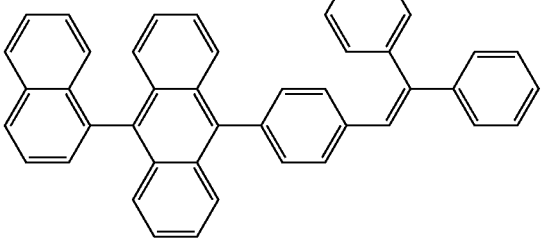

B-34
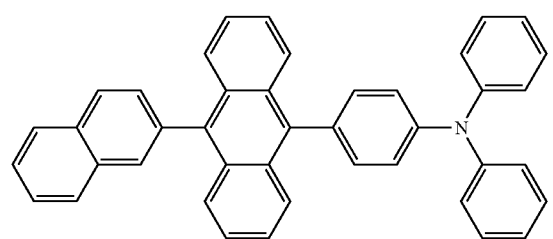
B-35
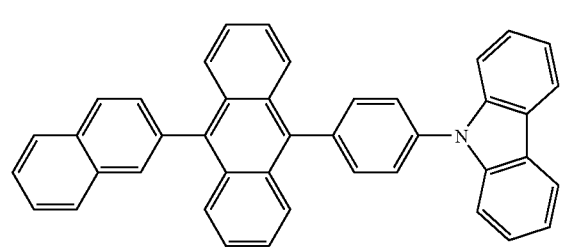
B-36
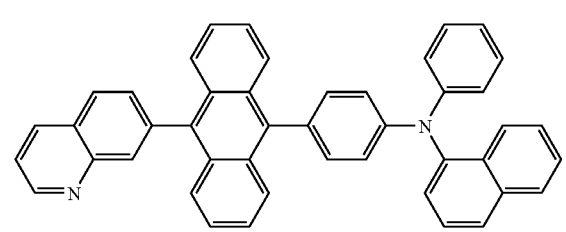
B-37
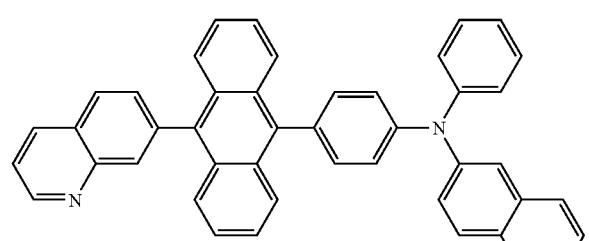
B-38
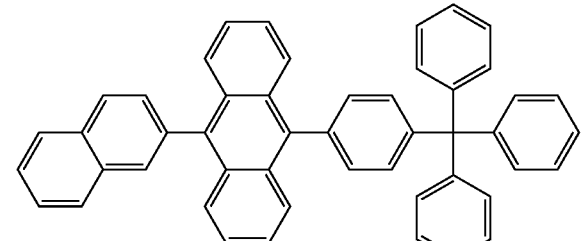
B-39
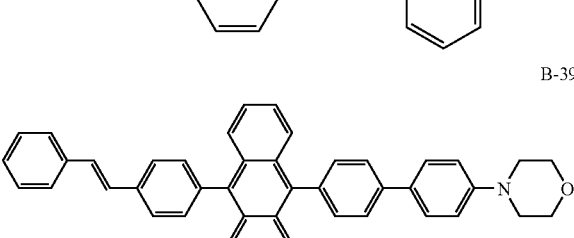
B-40
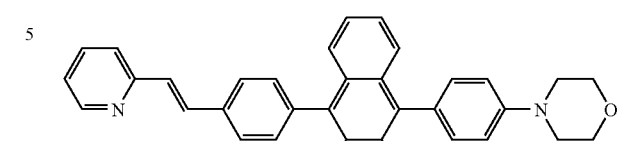
B-41
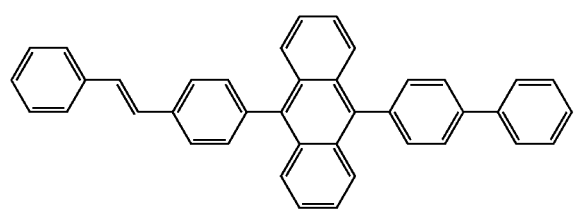
B-42
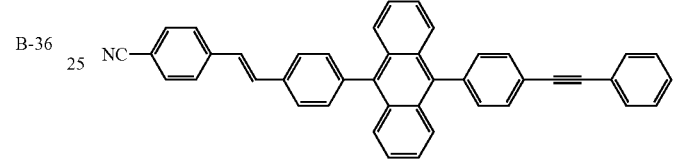
B-43
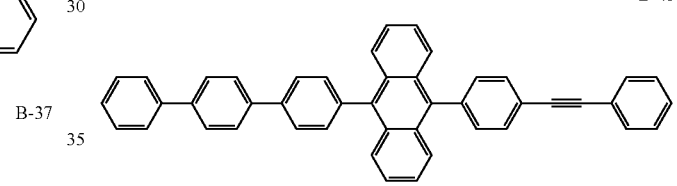
B-44
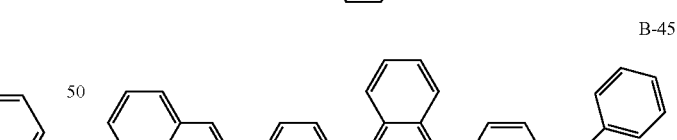
B-45
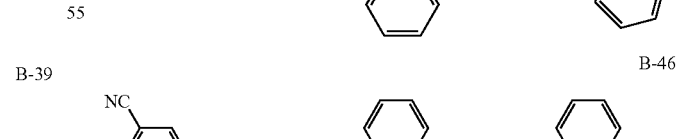
B-46
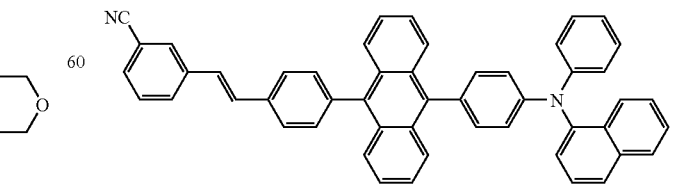

-continued
B-47
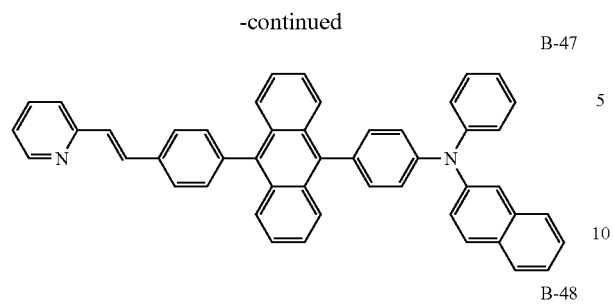
B-48
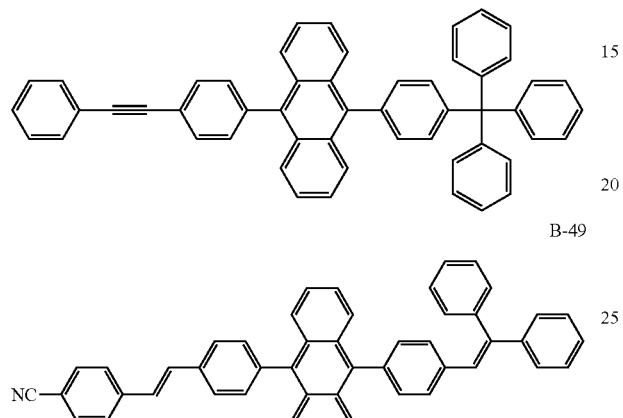
B-49
B-50
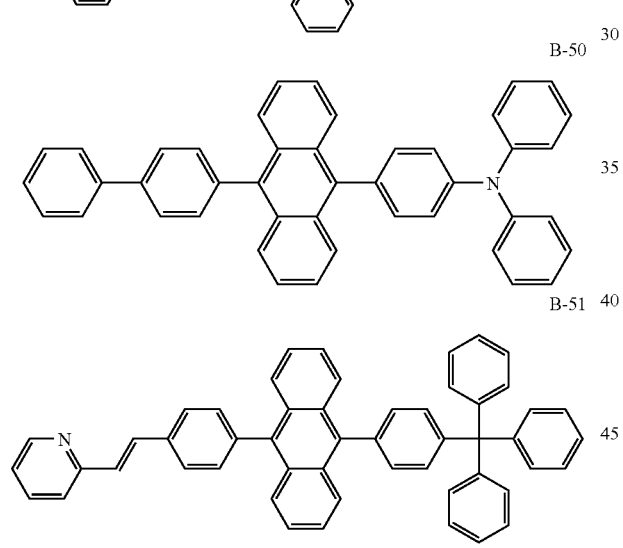
B-51
B-52
B-53
-continued
B-54
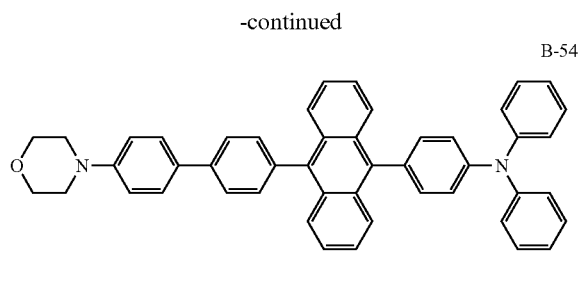
B-55
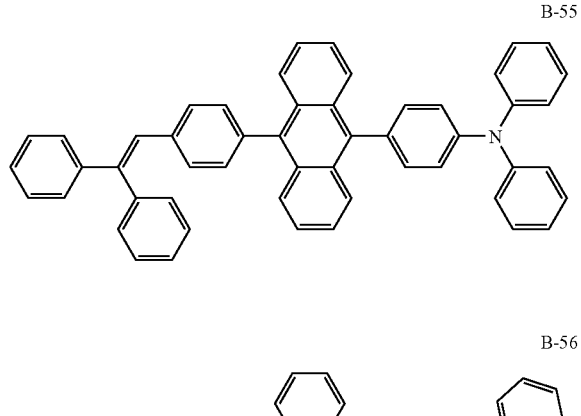
B-56
B-57
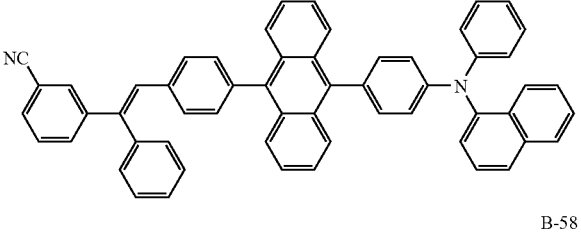
B-58
B-59
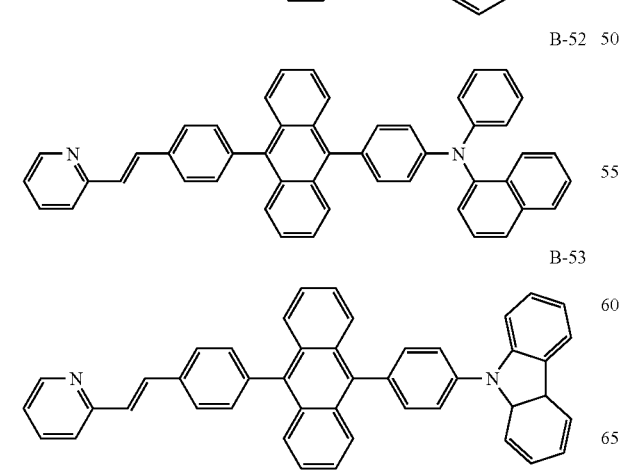

-continued

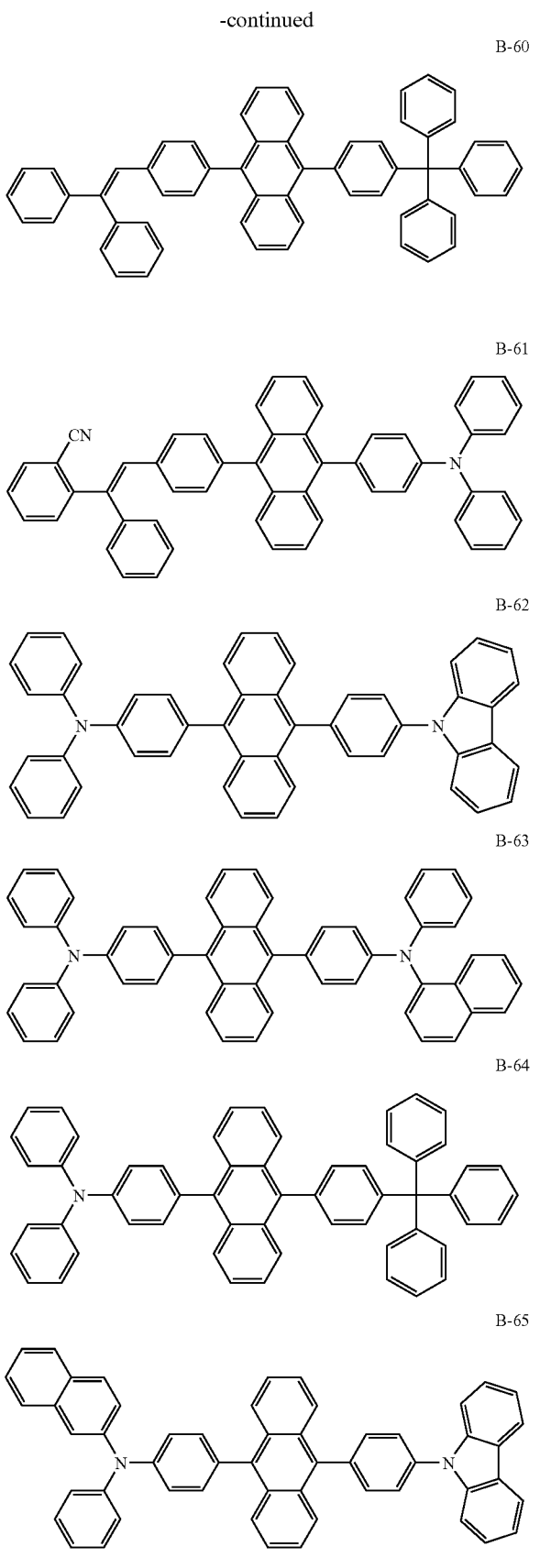

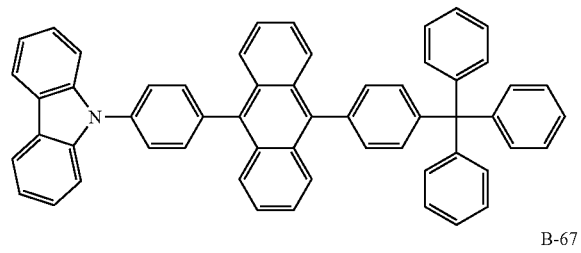

2. The device according to claim 1, further comprising:
a hole injection layer and a hole transport layer between the first electrode and the green, red, and blue emission layers.

3. The device according to claim 1, further comprising:
at least one of an electron transport layer or an electron injection layer between the hole blocking layer and the second electrode.

4. The device according to claim 1, wherein at least one of the green emission area or the red emission area is formed of a phosphorescent substance, and the blue emission layer is formed of a fluorescent substance.

5. The device according to claim 1, wherein the blue emission layer is formed from a plurality of substances and wherein the hole blocking layer is formed from one of the plurality of substances forming the blue emission area.

6. The device according to cliam 1, wherein the hole blocking layer is formed directly on the green, red, and blue emission layers.

7. The device according to claim 1, wherein the red and green emission layers are in contact with one another and the red and blue emission layers are in contact with one another.

8. A method for fabricating an organic electroluminescent device, comprising:
    forming a first electrode on a substrate;
    forming a green emission layer in a first emission area over the first electrode;
    forming a red emission layer in a second emission area over the first electrode;
    forming a blue emission layer in a third emission area over the first electrode;
    forming a hole blocking layer over the green, red, and blue emission layers by using a substance of the blue emission layer; and
    forming a second electrode over the hole blocking layer, wherein the green, red, and blue emission layers are substantially coplanar layers,
    wherein the hole blocking layer is formed of any one of a plurality of substances listed below:

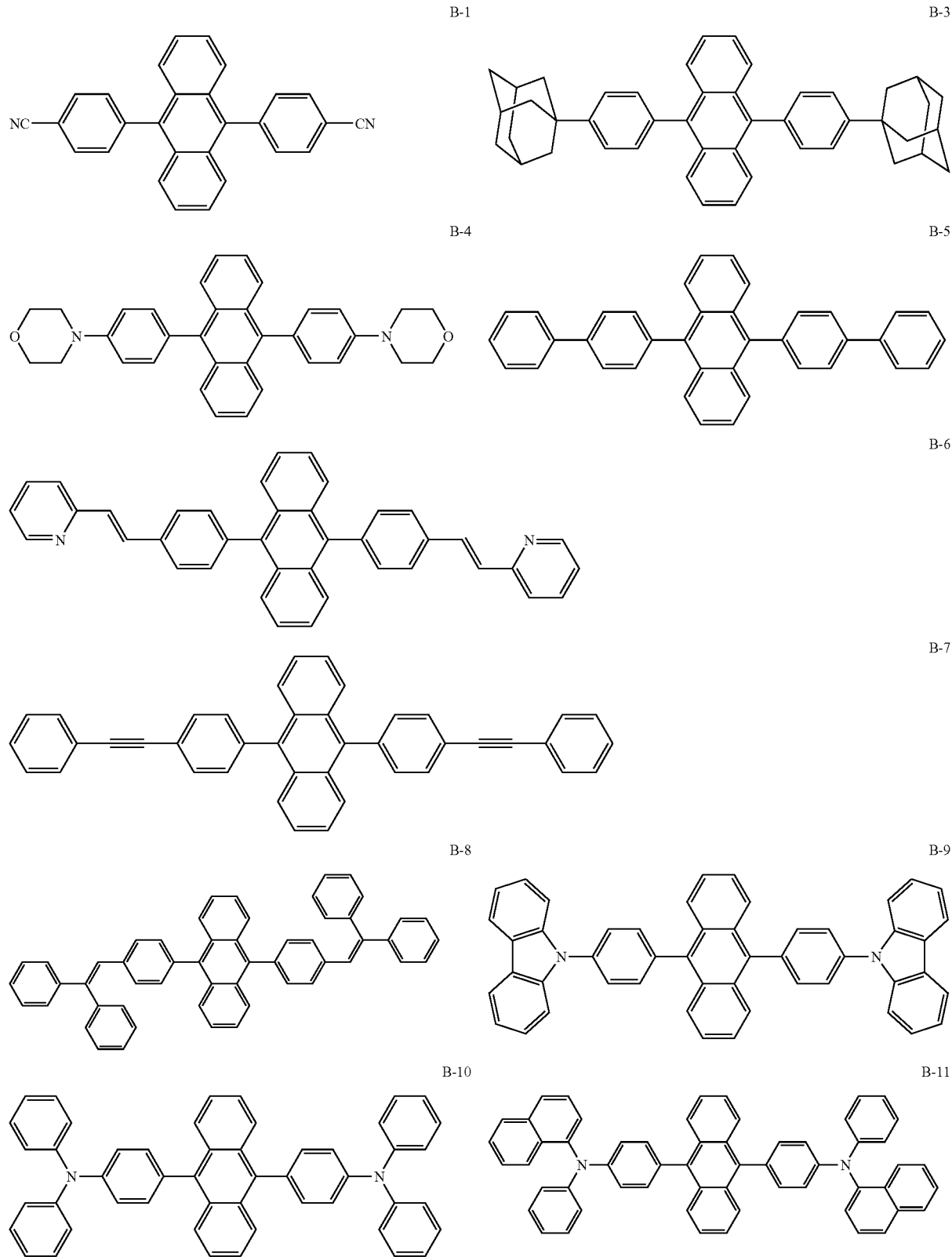

-continued
B-12
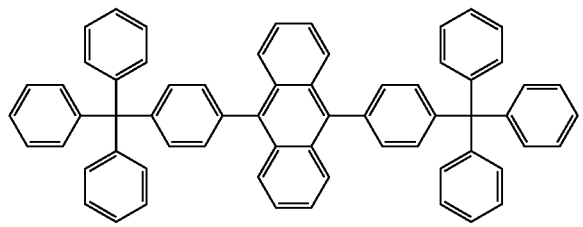
B-13
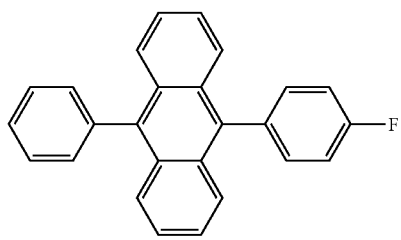
B-14
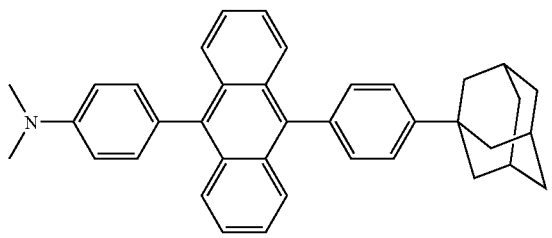
B-15
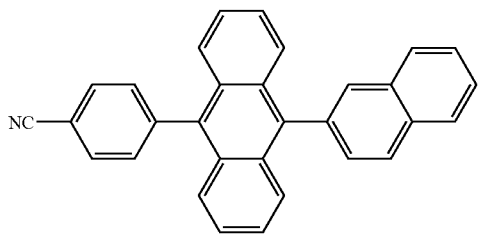
B-16
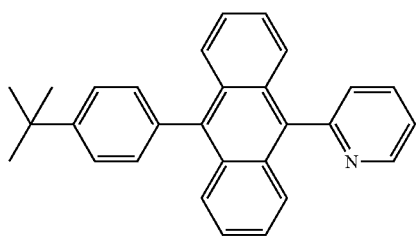
B-17
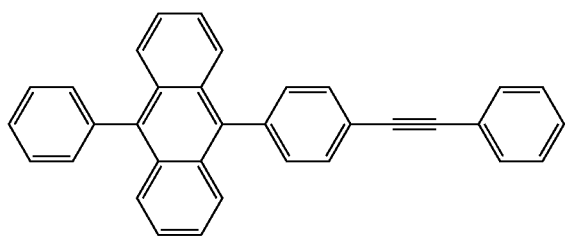
B-18
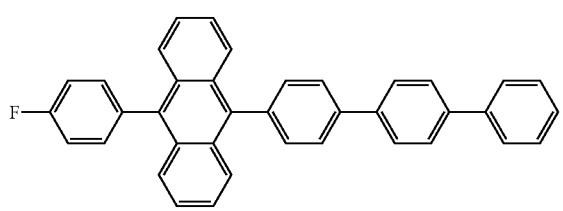
B-19
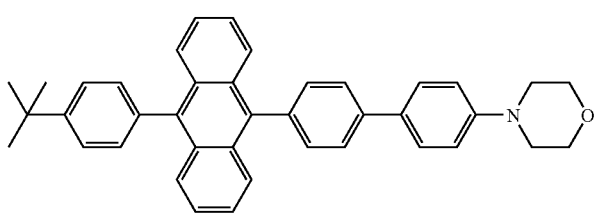
B-20
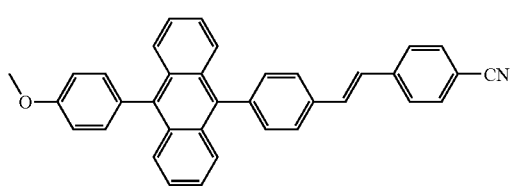
B-21
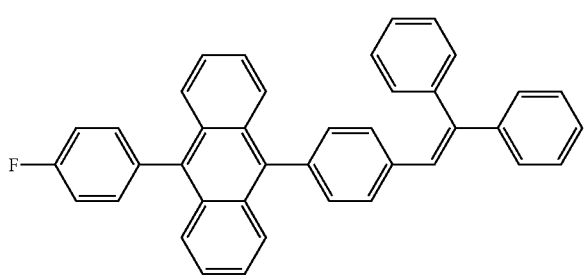
B-22
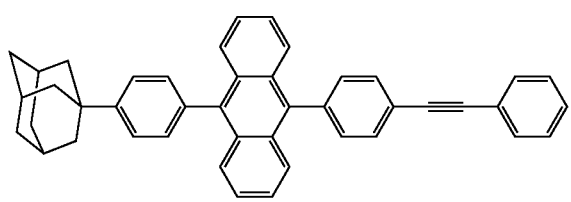
B-23
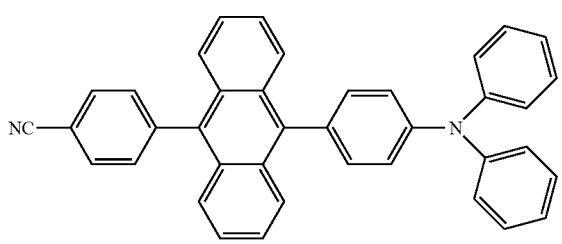

-continued
B-24
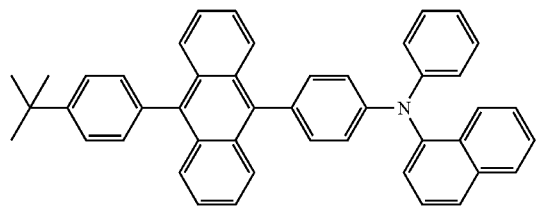
B-25
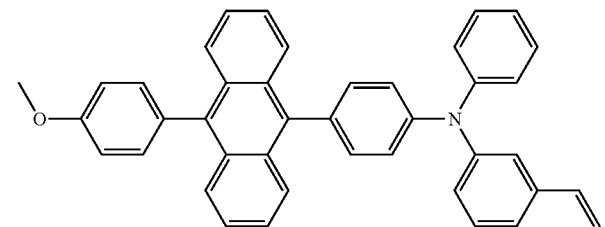
B-26
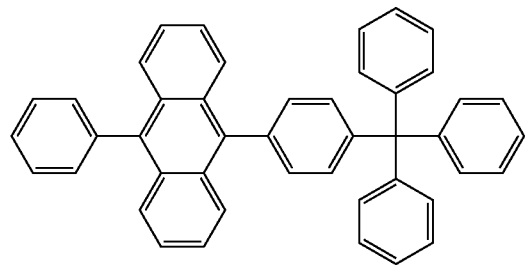
B-27
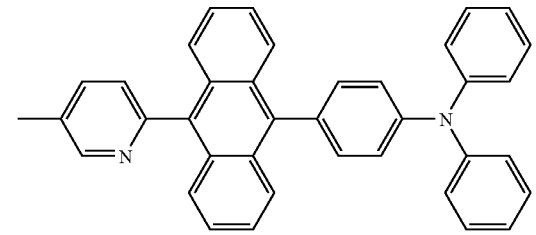
B-28
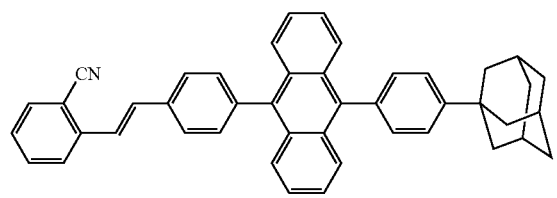
B-29
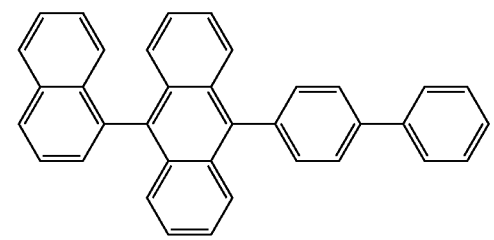
B-30
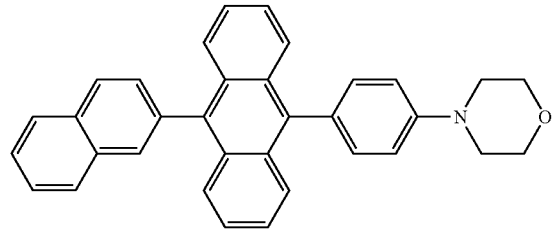
B-31
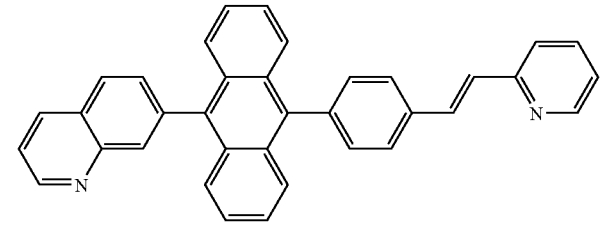
B-32
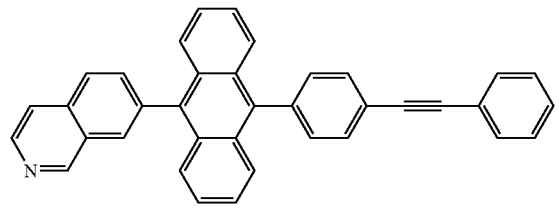
B-33
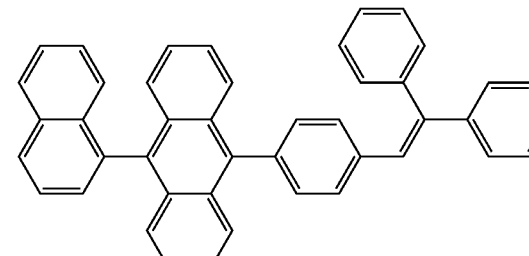
B-34
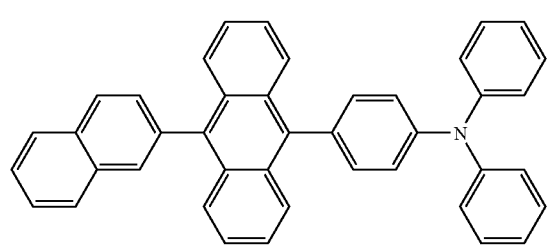
B-35
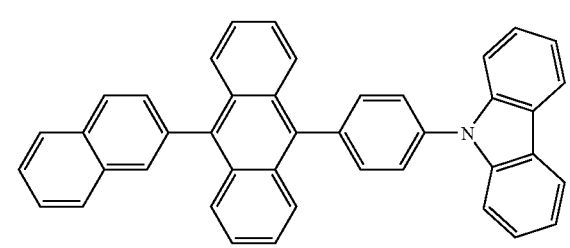

-continued
B-36
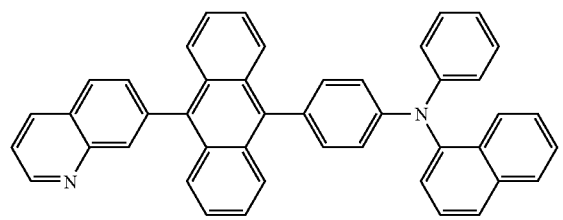
B-37
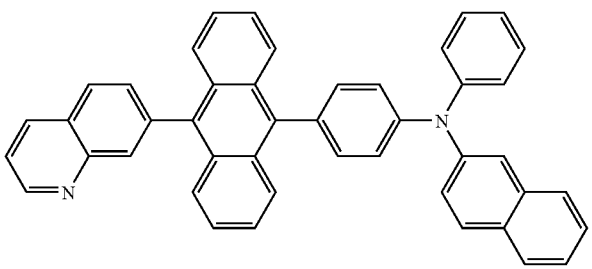
B-38
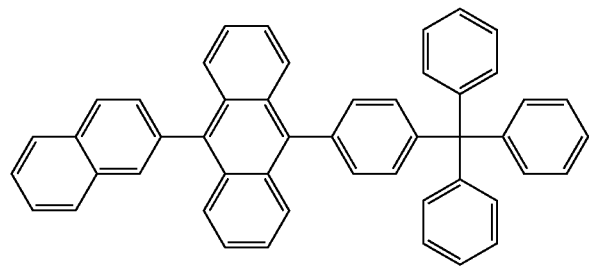
B-39
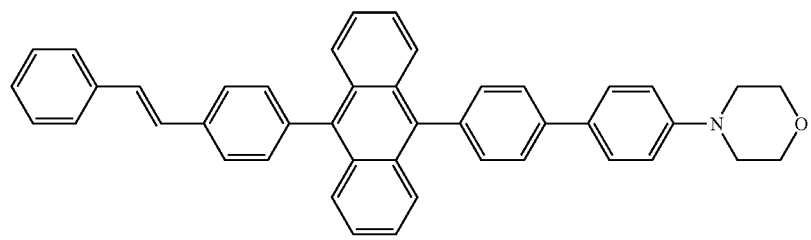
B-40
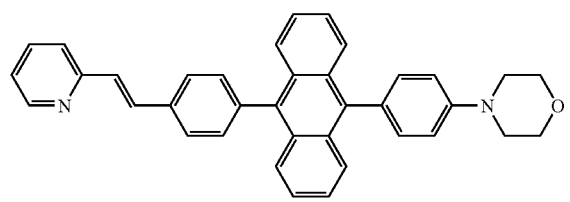
B-41
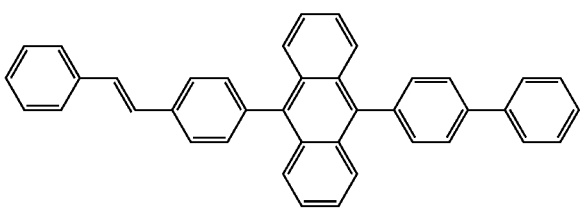
B-42
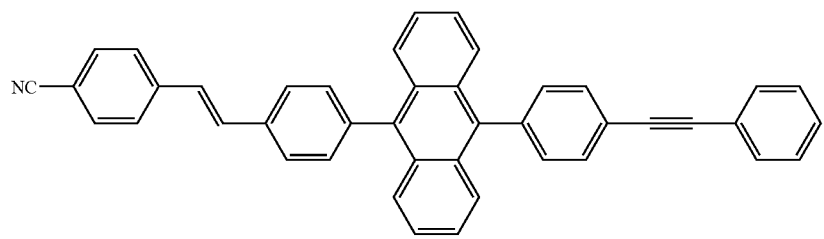
B-43
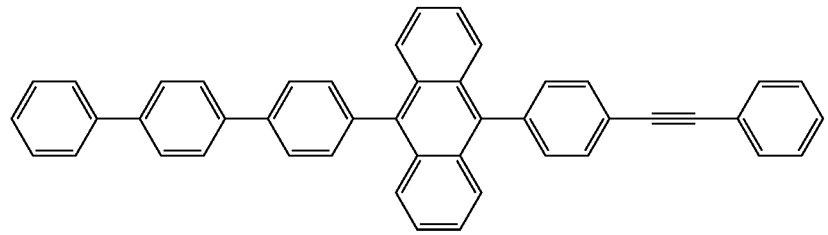

-continued
B-44
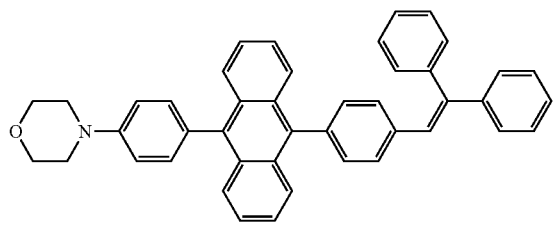
B-45
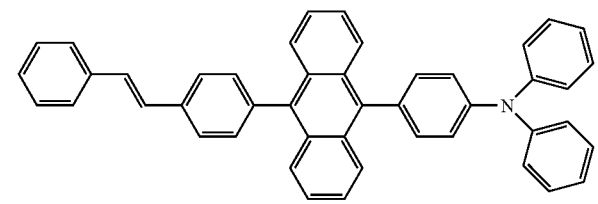
B-46
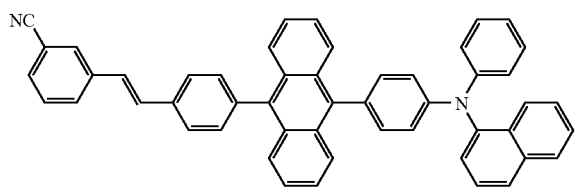
B-47
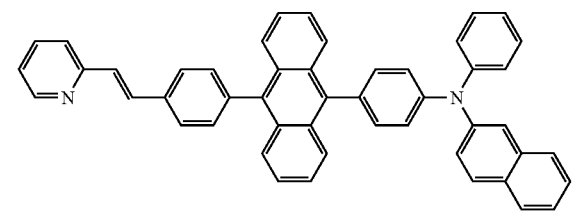
B-48
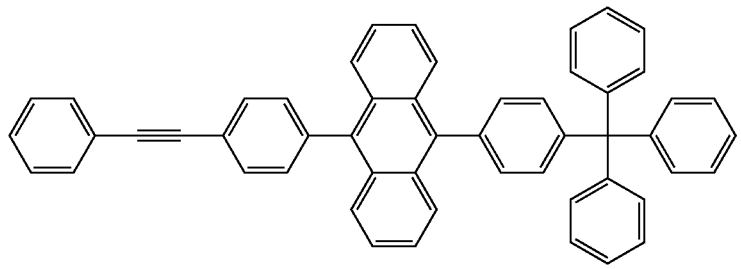
B-49
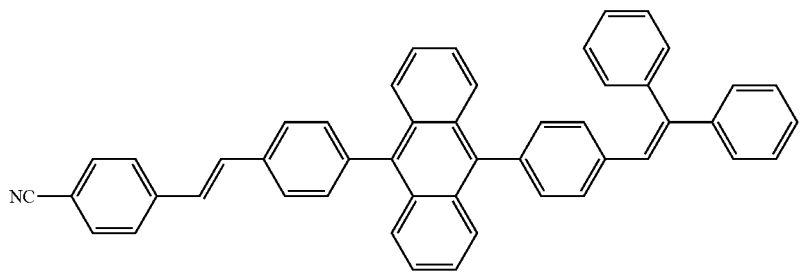
B-50
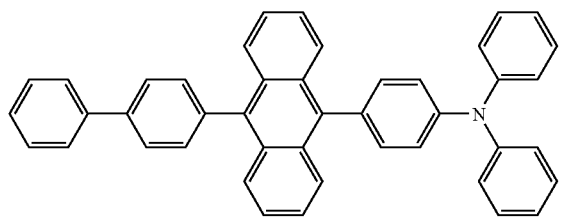
B-51
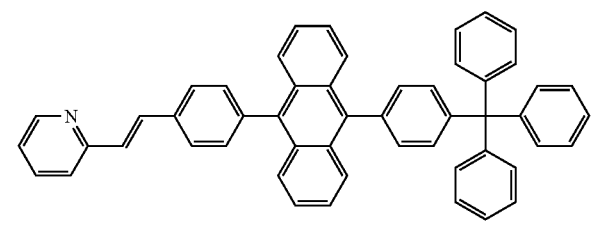
B-52
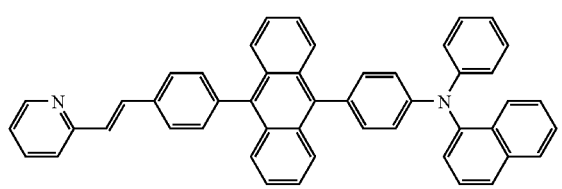
B-53
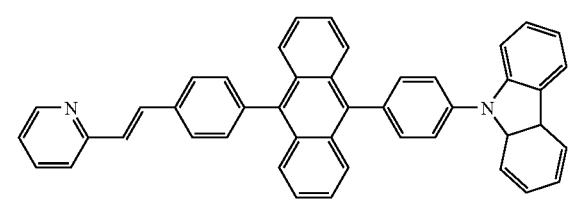

-continued
B-54
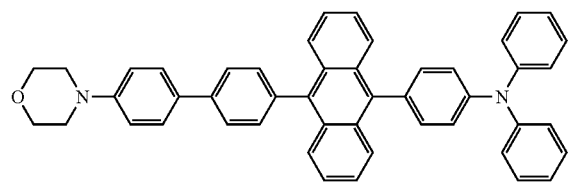
B-55
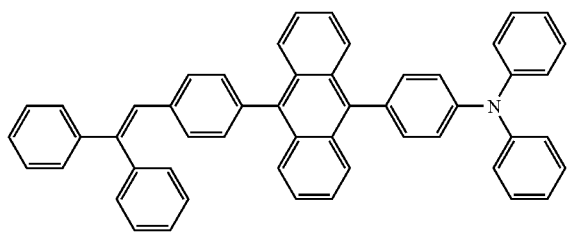
B-56
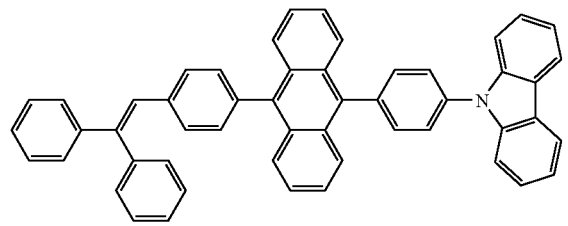
B-57
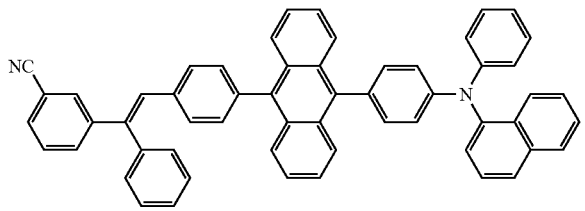
B-58
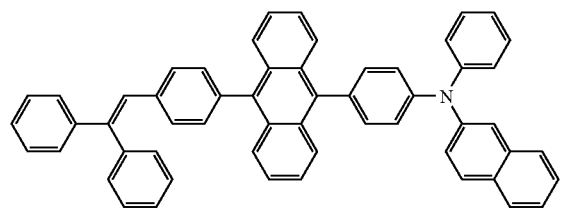
B-59
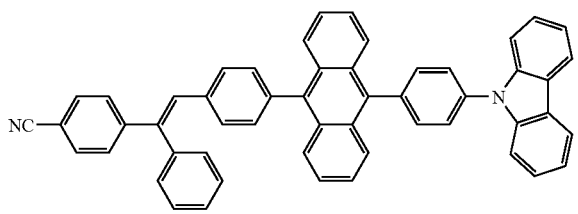
B-60
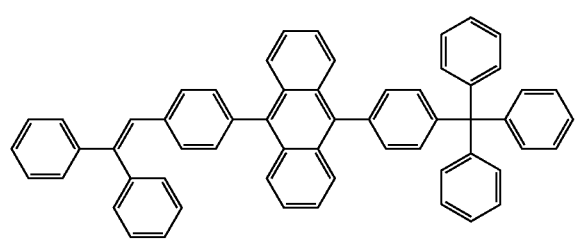
B-61
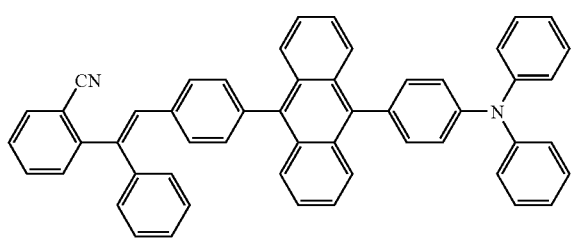
B-62
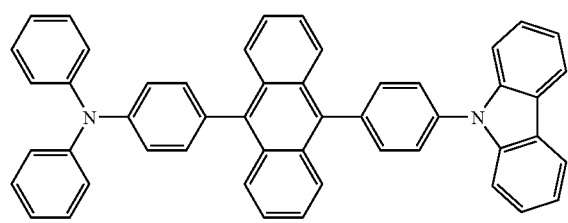
B-63
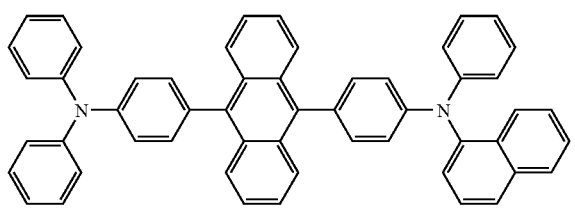
B-64
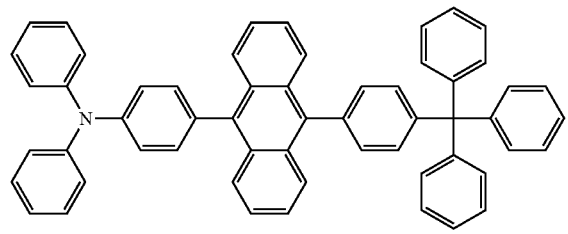
B-65
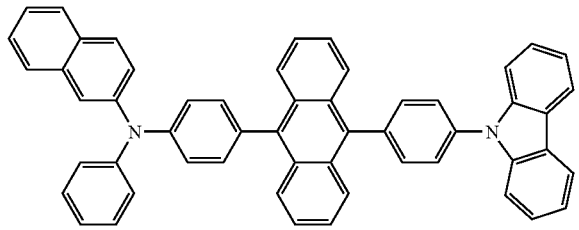

-continued

B-66

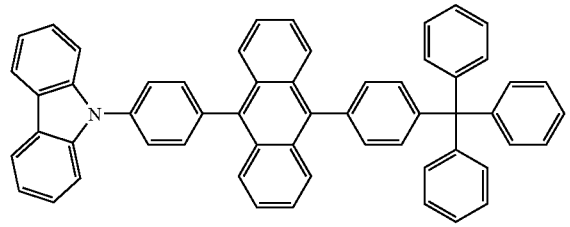

B-67

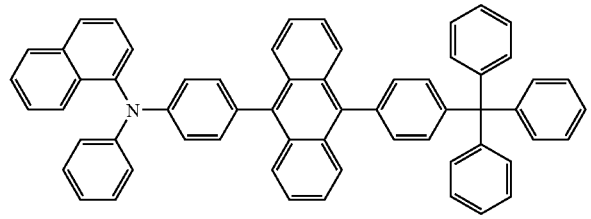

9. The method according to claim 8, further comprising:
sequentially forming a hole injection layer and a hole transport layer between the first electrode and the green, red, and blue emission layers.

10. The method according to claim 8, further comprising:
forming at least one of an electron transport layer or an electron injection layer between the hole blocking layer and the second electrode.

11. The method according to claim 8, wherein at least one of the green emission layer or the red emission layer is formed of a phosphorescent substance, and the blue emission layer is formed of a fluorescent substance.

12. The method according to claim 8, wherein the blue emission layer is formed from a plurality of substances and wherein the hole blocking layer is formed from one of the plurality of substances forming the blue emission layer.

13. The device according to claim 1, wherein the hole blocking layer is formed directly on the green, red, and blue emission layers.

14. An organic electroluminescent device, comprising:
a substrate;
a first electrode formed on the substrate;
a green emission layer formed in a first emission area, a red emission layer formed in a second emission area, and a blue emission layer formed in a third emission area;
a hole blocking layer formed over the green, red, and blue emission layers, the hole blocking layer being formed from at least one of a plurality of substances forming the blue emission layer; and
a second electrode formed over the hole blocking layer, wherein the green, red, and blue emission layers are substantially coplanar layers,
wherein the hole blocking layer is formed of any one of a plurality of substances listed below:

B-1

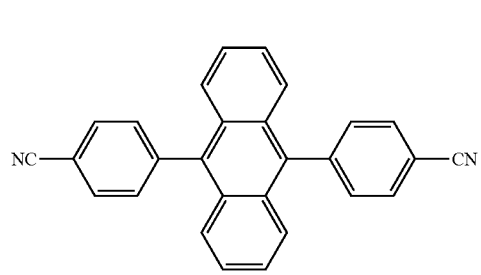

B-3

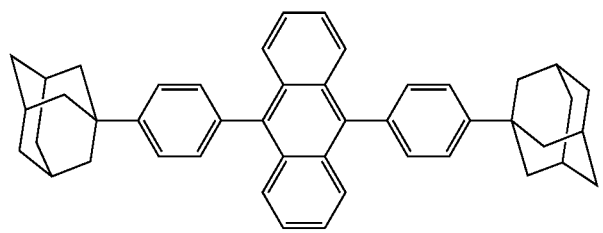

B-4

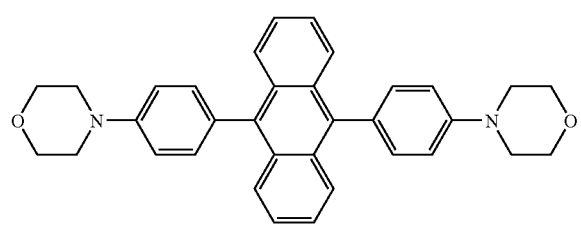

B-5

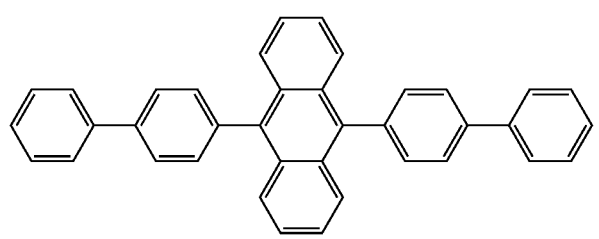

B-6

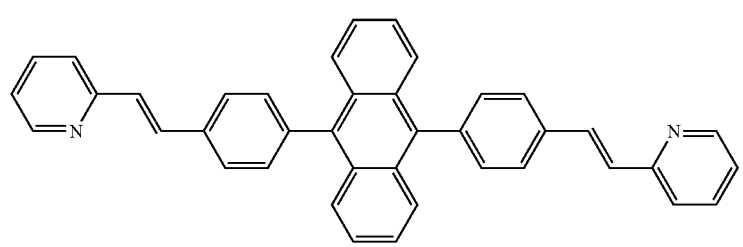

B-7
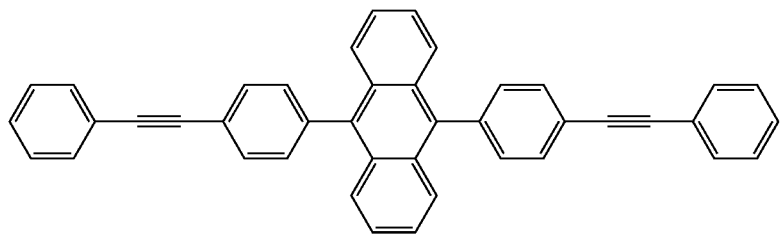
B-8
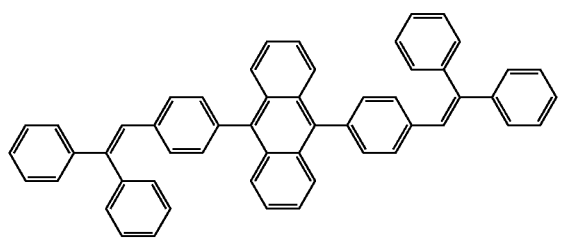
B-9
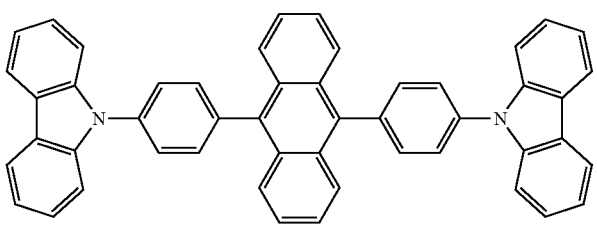
B-10
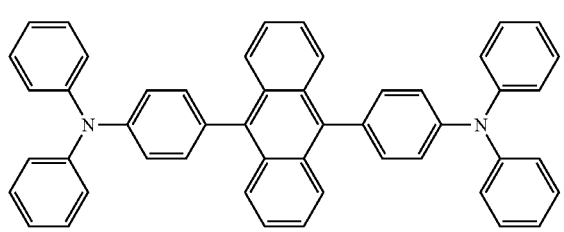
B-11
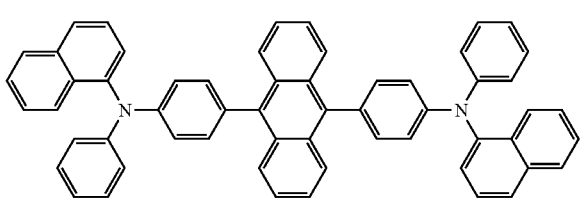
B-12
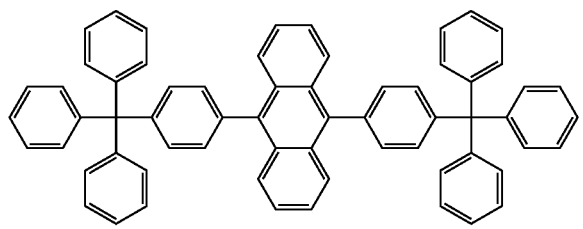
B-13
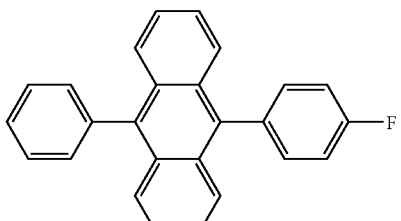
B-14
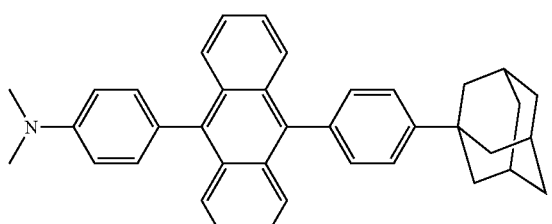
B-15
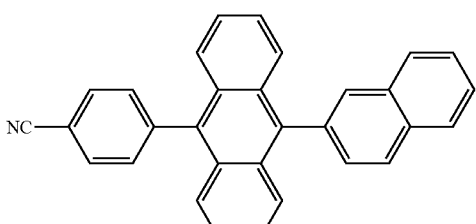
B-16
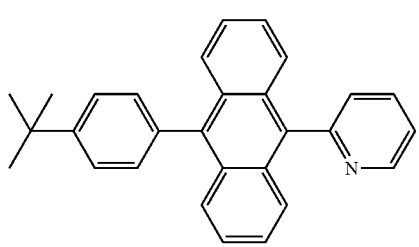
B-17
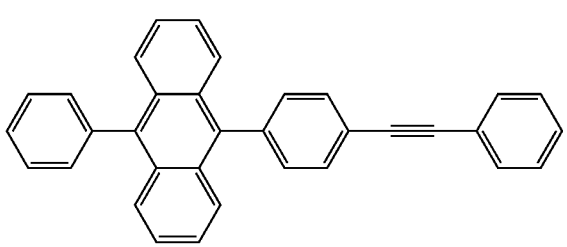

-continued
B-18
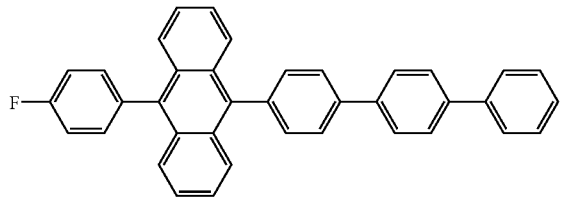
B-19
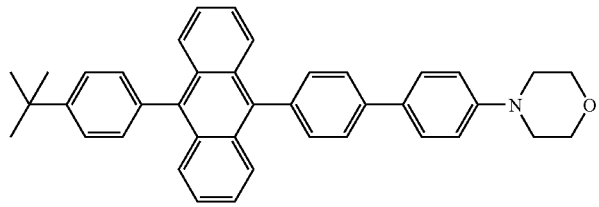
B-20
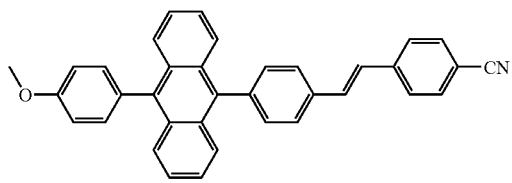
B-21
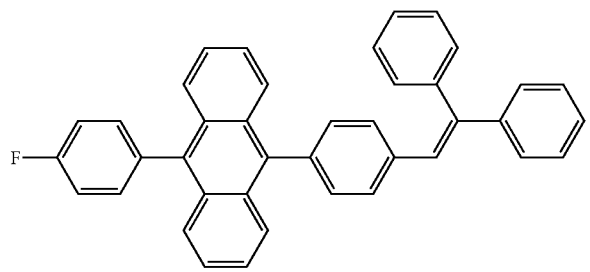
B-22
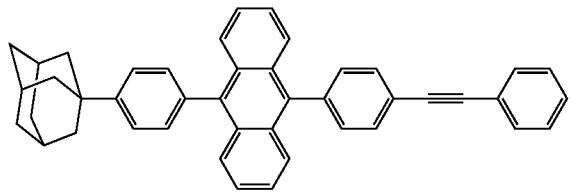
B-23
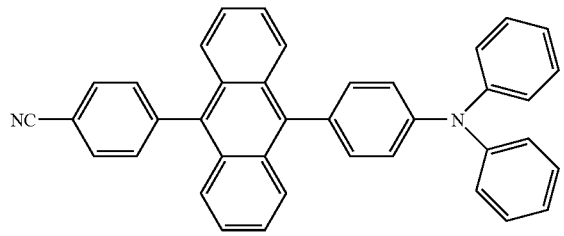
B-24
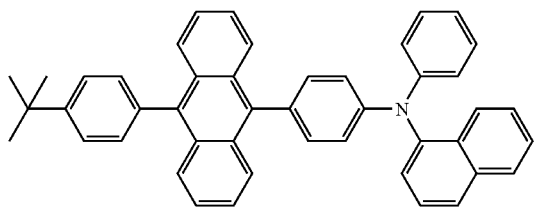
B-25
B-26
B-27
B-28
B-29

-continued
B-30
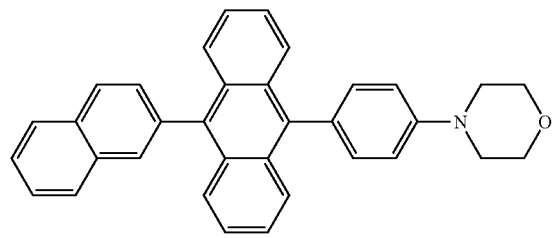
B-31
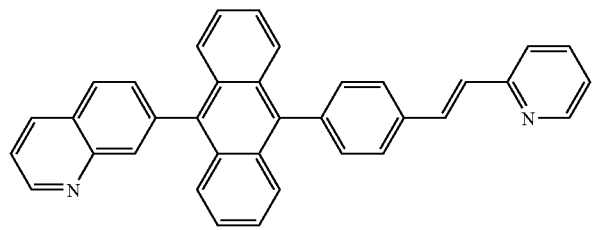
B-32
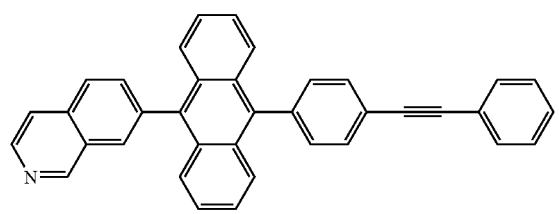
B-33
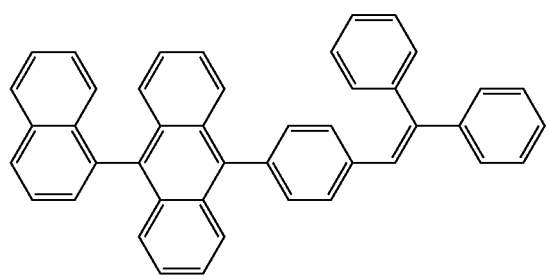
B-34
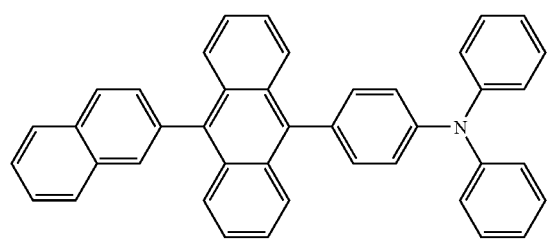
B-35
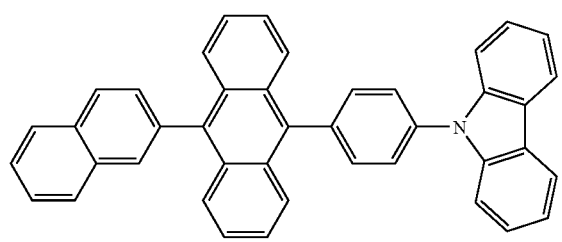
B-36
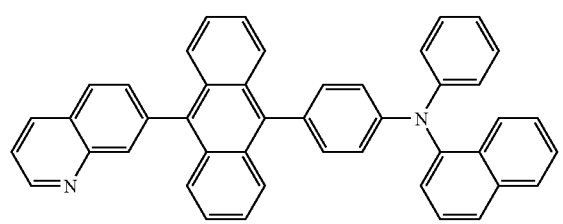
B-37
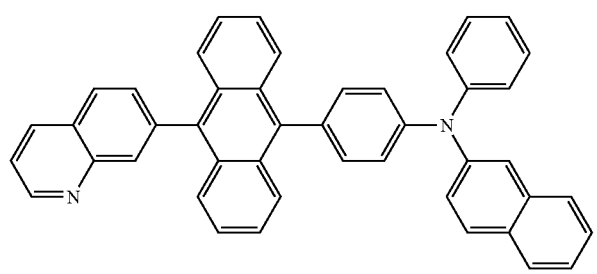
B-38
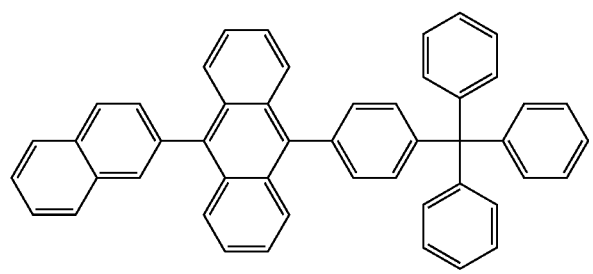
B-39
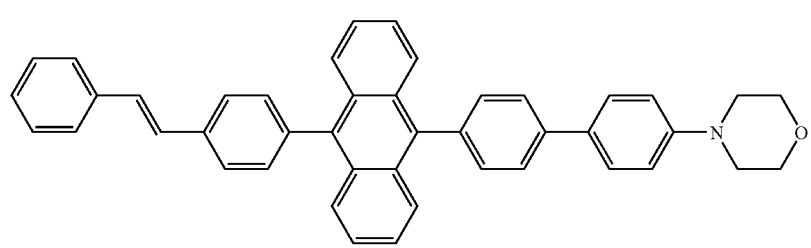

-continued
B-40 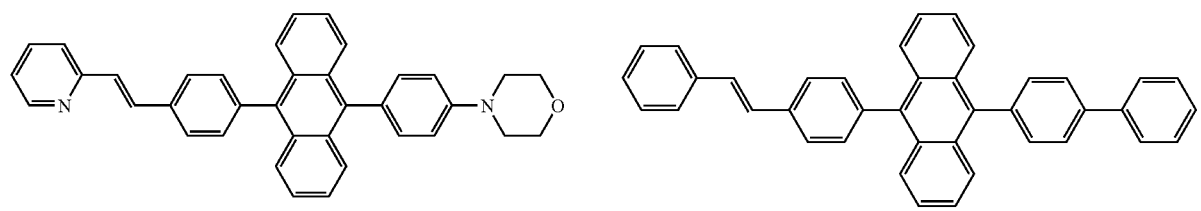 B-41
B-42 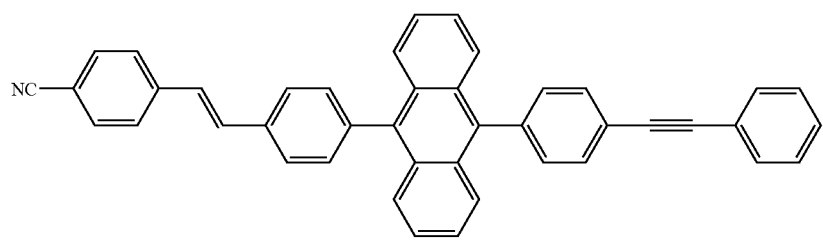
B-43 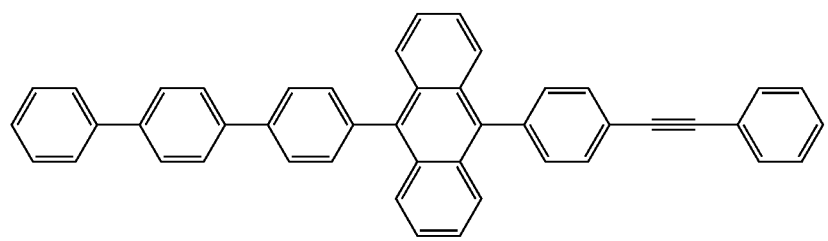
B-44 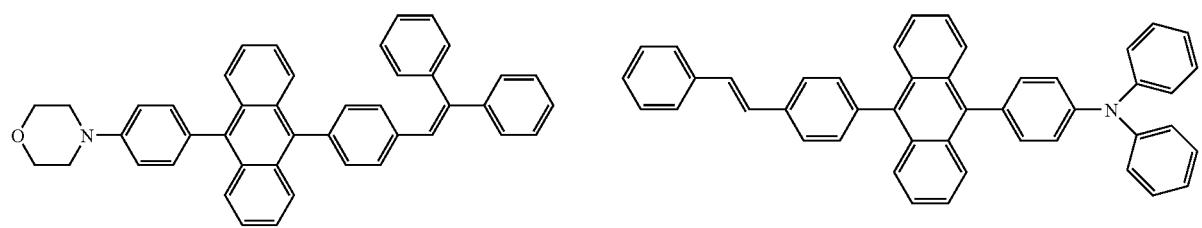 B-45
B-46 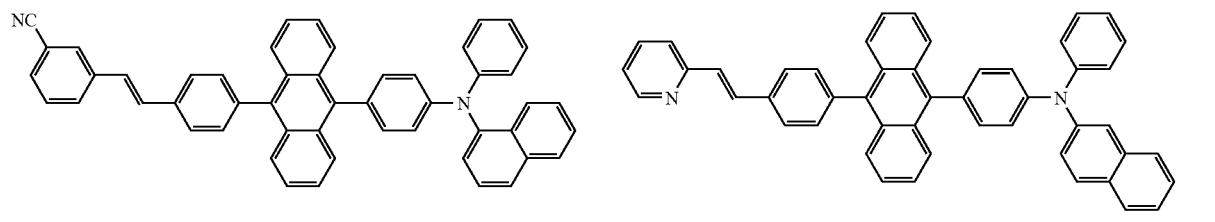 B-47
B-48 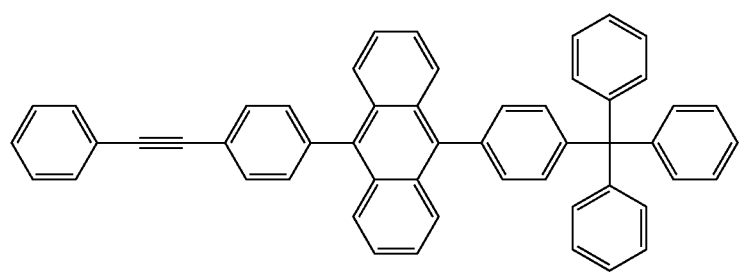

-continued
B-49
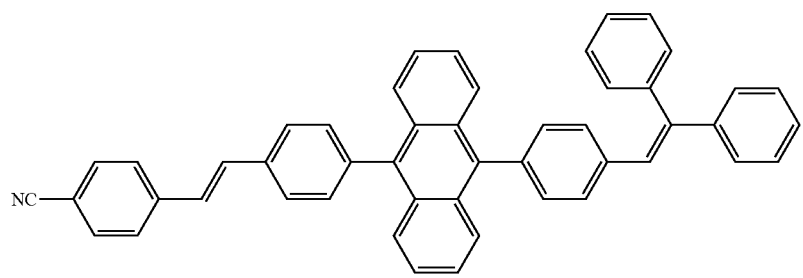
B-50
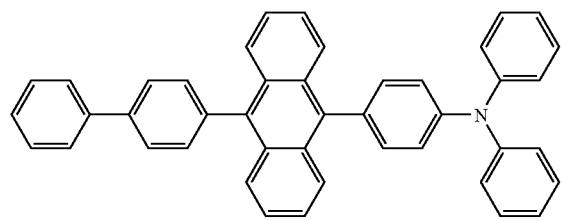
B-51
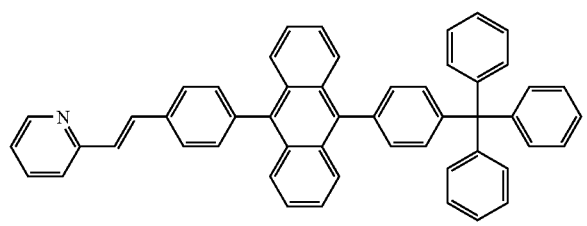
B-52
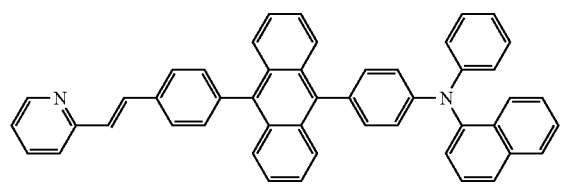
B-53
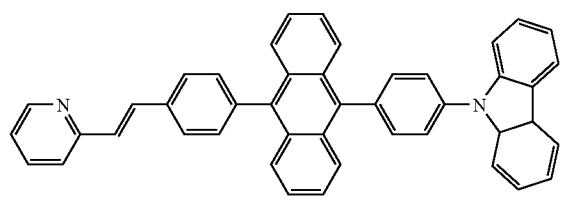
B-54
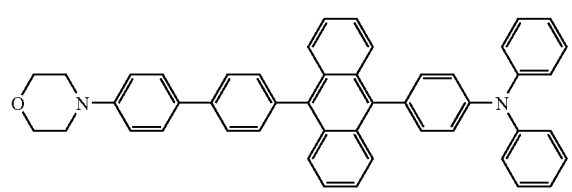
B-55
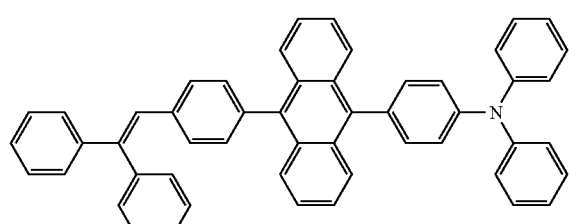
B-56
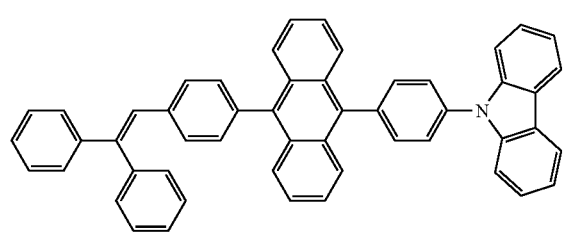
B-57
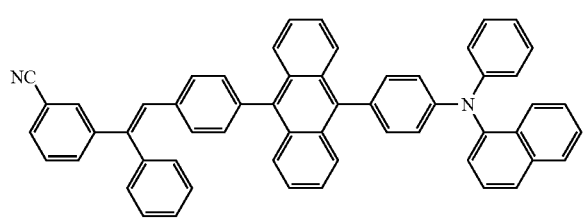
B-58
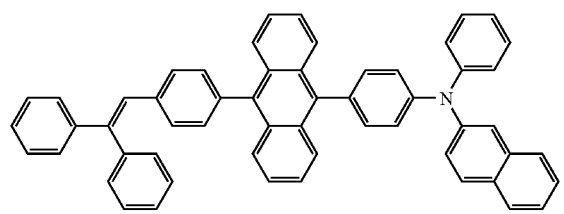
B-59
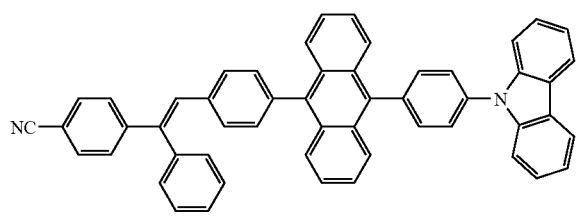

-continued
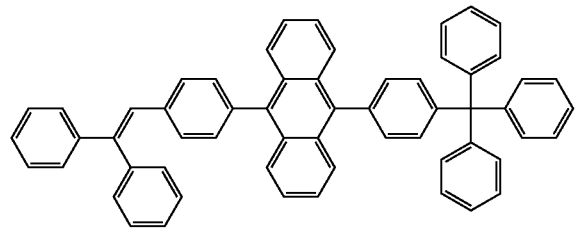
B-60
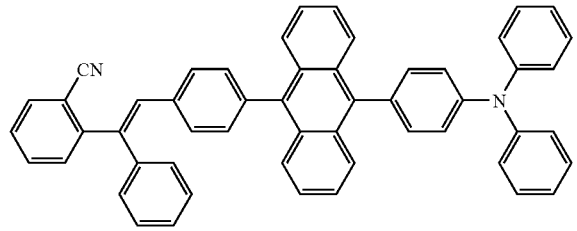
B-61
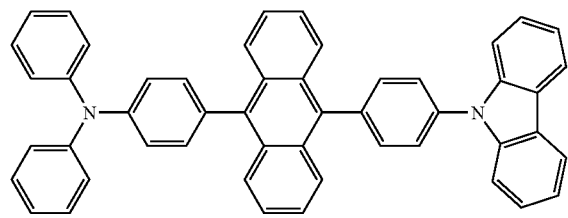
B-62
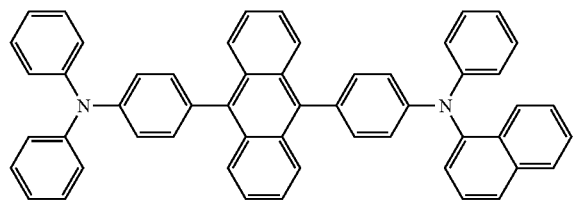
B-63
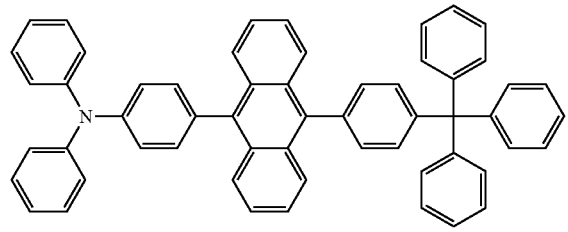
B-64
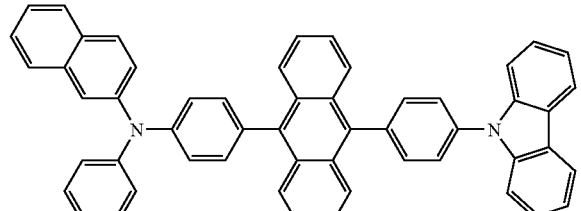
B-65
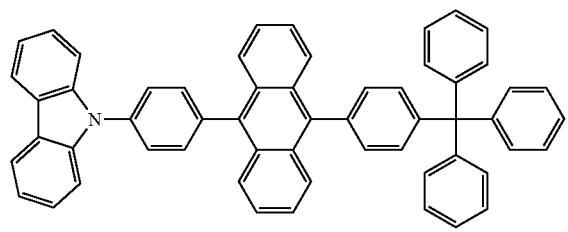
B-66
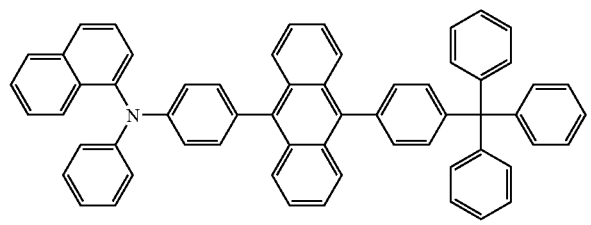
B-67
15. The device according to claim 14, wherein the hole blocking layer is formed one of a plurality of substances forming the blue emission layer.
* * * * *